United States Patent
Lee et al.

(10) Patent No.: US 9,798,209 B2
(45) Date of Patent: Oct. 24, 2017

(54) DISPLAY DEVICE AND METHOD OF MANUFACTURING THE SAME

(71) Applicant: Samsung Display Co., Ltd., Yongin-Si, Gyeonggi-Do (KR)

(72) Inventors: Seon Uk Lee, Seongnam-si (KR); Nam Seok Roh, Seongnam-si (KR); Hee-Keun Lee, Suwon-si (KR); Seok-Joon Hong, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/196,819

(22) Filed: Jun. 29, 2016

(65) Prior Publication Data

US 2016/0306207 A1    Oct. 20, 2016

Related U.S. Application Data

(62) Division of application No. 14/490,119, filed on Sep. 18, 2014, now Pat. No. 9,389,478.

(30) Foreign Application Priority Data

Apr. 18, 2014    (KR) .................. 10-2014-0046964

(51) Int. Cl.
*H01L 27/12* (2006.01)
*H01L 21/52* (2006.01)
(Continued)

(52) U.S. Cl.
CPC .......... *G02F 1/1368* (2013.01); *G02F 1/1337* (2013.01); *G02F 1/1339* (2013.01); *G02F 1/1341* (2013.01); *G02F 1/133345* (2013.01); *G02F 1/133377* (2013.01); *G02F 1/133512* (2013.01); *G02F 1/133514* (2013.01); *G02F 1/134309* (2013.01); *G02F 1/136227* (2013.01);
(Continued)

(58) Field of Classification Search
CPC ............... G02F 1/133377; G02F 2001/133742
See application file for complete search history.

(56) References Cited

U.S. PATENT DOCUMENTS 7,014,892 B2 * 3/2006 Nam ................. G02F 1/133711
                                                252/299.4
2006/0038937 A1 * 2/2006 Kaneko ............. G02F 1/133512
                                                349/110
(Continued)

FOREIGN PATENT DOCUMENTS

| KR | 1020120026880 A | 3/2012 |
| KR | 1020140087857 | 7/2014 |
| KR | 1020140094880 | 7/2014 |

*Primary Examiner* — Moazzam Hossain
*Assistant Examiner* — Farun Lu
(74) *Attorney, Agent, or Firm* — Innovation Counsel LLP

(57) ABSTRACT

A display device according to an exemplary embodiment includes: a substrate, a thin film transistor on the substrate, a pixel electrode connected to the thin film transistor, a common electrode on the pixel electrode to be spaced apart from the pixel electrode while a plurality of microcavities are interposed between the common electrode and the pixel electrode, a roof layer on the common electrode, an alignment layer on the pixel electrode and beneath the common electrode and including a photosensitive material, a liquid crystal layer filling the microcavities, and an encapsulation layer on the roof layer to seal the microcavities.

7 Claims, 18 Drawing Sheets

(51) Int. Cl.
*G02F 1/1333* (2006.01)
*G02F 1/1335* (2006.01)
*G02F 1/1334* (2006.01)
*G02F 1/1343* (2006.01)
*G02F 1/1341* (2006.01)
*G02F 1/1337* (2006.01)
*G02F 1/1339* (2006.01)
*G02F 1/1362* (2006.01)
*G02F 1/1368* (2006.01)
*H01L 21/56* (2006.01)

(52) U.S. Cl.
CPC .......... *H01L 21/56* (2013.01); *H01L 27/1259* (2013.01); *G02F 1/133711* (2013.01); *G02F 2001/133742* (2013.01); *G02F 2001/136222* (2013.01); *G02F 2201/123* (2013.01)

(56) References Cited

U.S. PATENT DOCUMENTS

| | | | |
|---|---|---|---|
| 2012/0062448 A1* | 3/2012 | Kim | G02F 1/133377 345/55 |
| 2012/0314159 A1 | 12/2012 | Sakai | |
| 2013/0182203 A1 | 7/2013 | Lee et al. | |
| 2014/0028925 A1 | 1/2014 | Choi et al. | |
| 2014/0335448 A1* | 11/2014 | Sekito | H01L 21/02126 430/18 |
| 2014/0349222 A1 | 11/2014 | Shibui et al. | |

* cited by examiner

DISPLAY DEVICE AND METHOD OF MANUFACTURING THE SAME

CROSS-REFERENCE TO RELATED APPLICATION

This application is a divisional application of U.S. patent application Ser. No. 14/490,119 filed on Sep. 18, 2014, which claims priority to and the benefit of Korean Patent Application No. 10-2014-0046964 filed in the Korean Intellectual Property Office on Apr. 18, 2014, the entire contents of which are incorporated herein by reference.

BACKGROUND (a) Technical Field

The present application relates to a display device and a method of manufacturing the same, and more particularly, to a display device and a method of manufacturing the same, which can simplify a process.

(b) Description of the Related Art

A liquid crystal display is one of the most common types of flat panel displays currently in use, and includes two display panels with field generating electrodes such as a pixel electrode and a common electrode, and a liquid crystal layer interposed therebetween. The liquid crystal display displays an image by applying a voltage to a field generating electrode to generate an electric field on the liquid crystal layer, determine alignment of liquid crystal molecules of the liquid crystal layer therethrough, and control polarization of incident light.

The two display panels constituting the liquid crystal display may be formed of a thin film transistor array panel and a counter display panel. In the thin film transistor array panel, a gate line transferring a gate signal and a data line transferring a data signal are formed to cross each other, and a thin film transistor connected to the gate line and the data line, a pixel electrode connected to the thin film transistor, and the like may be formed. A light blocking member, a color filter, a common electrode, and the like may be formed in the counter display panel. If necessary, the light blocking member, the color filter, and the common electrode may be formed in the thin film transistor array panel.

However, in an existing liquid crystal display, there are problems in that two substrates are essentially used and constituent elements are formed on each of the two substrates, and thus a display device is heavy and thick, a cost thereof is high, and a process time is long.

The above information disclosed in this Background section is only for enhancement of understanding of the background and therefore it may contain information that does not form the prior art that is already known in this country to a person of ordinary skill in the art.

SUMMARY

Embodiments have been made in an effort to provide a display device and a method of manufacturing the same, which can reduce a weight, a thickness, cost, and a process time by manufacturing the display device by using one substrate.

Further, embodiments been made in an effort to provide a display device and a method of manufacturing the same, which can simplify a process.

An exemplary embodiment provides a display device including: a substrate, a thin film transistor on the substrate, a pixel electrode connected to the thin film transistor, a common electrode on the pixel electrode to be spaced apart from the pixel electrode while a plurality of microcavities are interposed between the common electrode and the pixel electrode, a roof layer on the common electrode, an alignment layer on the pixel electrode and beneath the common electrode and including a photosensitive material, a liquid crystal layer filling the microcavities, and an encapsulation layer on the roof layer to seal the microcavities.

The alignment layer may further include a siloxane resin.

The photosensitive material may be formed of at least any one of a PAC (photoactive compound), a PAG (photoacid generator), and a photoinitiator.

The alignment layer may include a sulfur component and a chlorine component.

The display device according to the exemplary embodiment may further include a color filter positioned beneath the pixel electrode, and an insulating layer between the color filter and the pixel electrode and formed of an organic insulating material, in which the pixel electrode may be directly on the insulating layer.

The display device according to the exemplary embodiment may further include a light blocking member between the plurality of microcavities, in which the light blocking member may be positioned directly beneath the encapsulation layer.

The light blocking member may be positioned on the pixel electrode and the insulating layer.

Another exemplary embodiment provides a display device including: a substrate, a thin film transistor on the substrate, a pixel electrode connected to the thin film transistor, a common electrode on the pixel electrode to be spaced apart from the pixel electrode while a plurality of microcavities are interposed between the common electrode and the pixel electrode, a roof layer on the common electrode, an alignment layer on the pixel electrode and beneath the common electrode, an altered layer between the pixel electrode and the alignment layer and between the common electrode and the alignment layer, a liquid crystal layer filling the microcavities, and an encapsulation layer on the roof layer to seal the microcavities.

The display device according to the exemplary embodiment may further include a color filter positioned beneath the pixel electrode, and an insulating layer between the color filter and the pixel electrode and formed of an organic insulating material, in which the pixel electrode may be directly on the insulating layer.

The display device may further include a light blocking member between the plurality of microcavities, in which the light blocking member may be positioned directly beneath the encapsulation layer.

Yet another exemplary embodiment provides a method of manufacturing a display device, including: forming a thin film transistor on a substrate, forming a pixel electrode to be connected to the thin film transistor, forming a sacrificial layer on the pixel electrode, forming a common electrode on the sacrificial layer, forming a roof layer on the common electrode, patterning the common electrode and the roof layer to expose a portion of the sacrificial layer, removing the sacrificial layer to form a microcavity between the pixel electrode and the common electrode, injecting a liquid crystal material into the microcavity to form a liquid crystal layer, and forming an encapsulation layer to cover a portion where the microcavity is exposed and to seal the microcavity, in which in the removing of the sacrificial layer, a portion of the sacrificial layer, which contacts with the pixel electrode and the common electrode, remains to form an alignment layer.

The sacrificial layer may include a photosensitive material, a siloxane resin, and a reaction group.

The photosensitive material may be formed of at least any one of a PAC (photoactive compound), a PAG (photoacid generator), and a photoinitiator.

The reaction group may be formed of an alkyl group or a methyl group.

The alignment layer may include a sulfur component and a chlorine component.

The removing of the sacrificial layer may include a process of supplying a stripper solution to a portion where the sacrificial layer is exposed.

The removing of the sacrificial layer may not include an oxygen ashing process.

Still another exemplary embodiment provides a method of manufacturing a display device, including: forming a thin film transistor on a substrate, forming a pixel electrode to be connected to the thin film transistor, forming a sacrificial layer on the pixel electrode, forming a common electrode on the sacrificial layer, forming a roof layer on the common electrode, patterning the common electrode and the roof layer to expose a portion of the sacrificial layer, removing the sacrificial layer to form a microcavity between the pixel electrode and the common electrode, injecting an alignment material into the microcavity to form an alignment layer on the pixel electrode and beneath the common electrode, injecting a liquid crystal material into the microcavity to form a liquid crystal layer, and forming an encapsulation layer to cover a portion where the microcavity is exposed and to seal the microcavity, in which in the removing of the sacrificial layer, a portion of the sacrificial layer, which contacts with the pixel electrode and the common electrode, remains to form an altered layer.

The altered layer may be positioned between the pixel electrode and the alignment layer and between the common electrode and the alignment layer.

The removing of the sacrificial layer may include a process of supplying a stripper solution to a portion where the sacrificial layer is exposed but may not include an oxygen ashing process.

According to the exemplary embodiments, the display device and the method of manufacturing the same have the following effects.

In the display device and the method of manufacturing the same according to the exemplary embodiment, it is possible to reduce a weight, a thickness, cost, and a process time by manufacturing the display device by using one substrate.

Further, it is possible to simplify a process by omitting a process of removing an altered layer generated by altering a sacrificial layer.

DETAILED DESCRIPTION OF THE EMBODIMENTS

Figure 1:
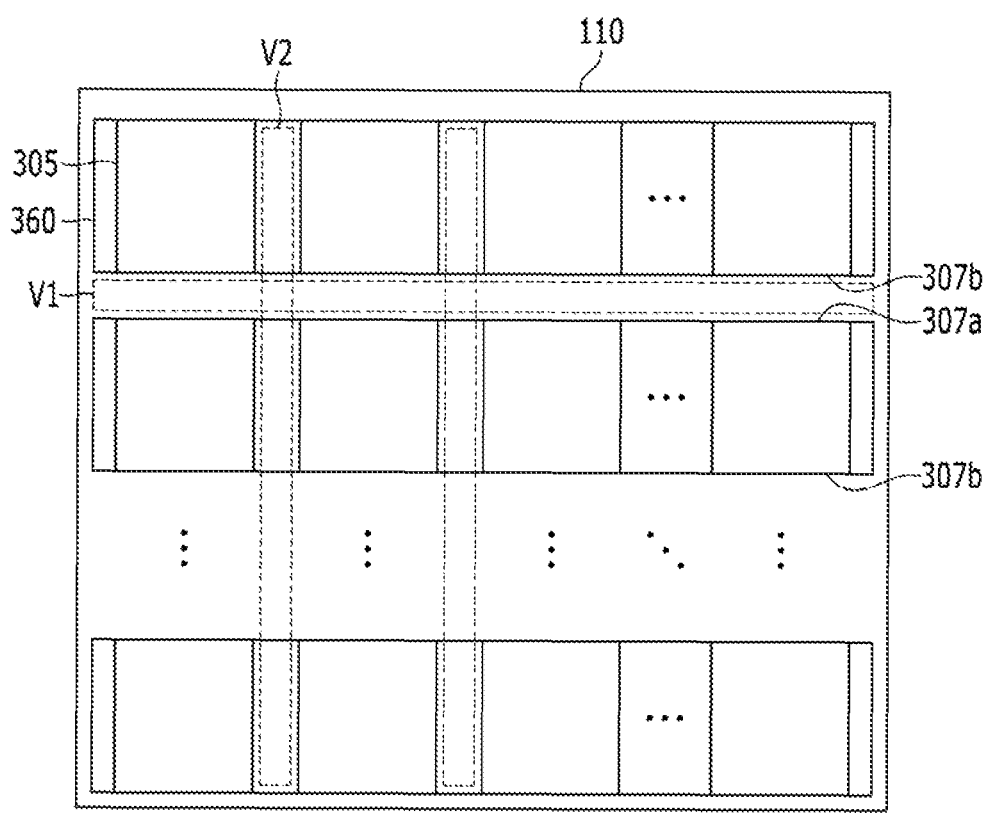
FIG. 1 is a top plan view illustrating a display device according to an exemplary embodiment.

The inventive concept will be described more fully hereinafter with reference to the accompanying drawings, in which exemplary embodiments are shown. As those skilled in the art would realize, the described embodiments may be modified in various different ways, all without departing from the spirit or scope of the inventive concept.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

First, a display device according to an exemplary embodiment will be schematically described below with reference to FIG. 1.

FIG. 1 is a top plan view illustrating the display device according to the exemplary embodiment.

The display device according to the exemplary embodiment includes a substrate 110 made of a material such as glass or plastic.

A microcavity 305 covered by a roof layer 360 is formed on the substrate 110. The roof layer 360 extends in a row direction, and a plurality of microcavities 305 are formed beneath one roof layer 360.

The microcavities 305 may be disposed in a matrix form, a first valley V1 is positioned between the microcavities 305 adjacent in a column direction, and a second valley V2 is positioned between the microcavities 305 adjacent in a row direction.

A plurality of roof layers 360 are separated from each other while the first valley V1 is interposed therebetween. The microcavities 305 may not be covered by the roof layer 360 but may be exposed to the outside at a portion that is in contact with the first valley V1. These are called injection holes 307a and 307b.

The injection holes 307a and 307b are formed at both edges of the microcavity 305. The injection holes 307a and 307b are formed of a first injection hole 307a and a second injection hole 307b, the first injection hole 307a is formed to expose a lateral surface of a first edge of the microcavity 305, and the second injection hole 307b is formed to expose a lateral surface of a second edge of the microcavity 305. The lateral surface of the first edge and the lateral surface of the second edge of the microcavity 305 face each other.

Each roof layer 360 is formed to be spaced apart from the substrate 110 between the adjacent second valleys V2, thus forming the microcavity 305. That is, the roof layer 360 is formed to cover residual lateral surfaces other than the lateral surfaces of the first edge and the second edge in which the injection holes 307a and 307b are formed.

The aforementioned structure of the display device according to the exemplary embodiment is just an example, and various modifications are feasible. For example, a disposal form of the microcavity 305, the first valley V1, and the second valley V2 can be changed, a plurality of roof layers 360 may be connected to each other in the first valley V1, and a portion of each roof layer 360 may be formed to be spaced apart from the substrate 110 in the second valley V2, so that the adjacent microcavities 305 may be connected to each other.

Hereinafter, one pixel of the display device according to the exemplary embodiment will be schematically described below with reference to FIG. 2.

Figure 2:
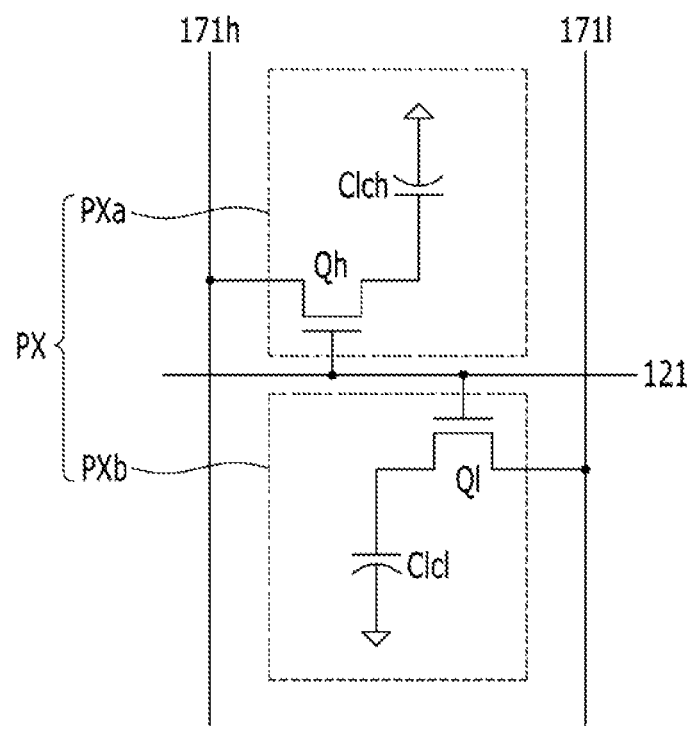
FIG. 2 is an equivalent circuit diagram of one pixel of the display device according to an exemplary embodiment.

FIG. 2 is an equivalent circuit diagram of one pixel of the display device according to an exemplary embodiment.

The display device according to the exemplary embodiment includes a plurality of signal lines 121, 171h, and 171l and a pixel PX connected thereto. Although not illustrated in the drawings, a plurality of pixels PX may be disposed in a matrix form including a plurality of pixel rows and a plurality of pixel columns.

Each pixel PX may include a first sub-pixel PXa and a second sub-pixel PXb. The first sub-pixel PXa and the second sub-pixel PXb may be vertically disposed. In this case, the first valley V1 may be positioned in a pixel row direction between the first sub-pixel PXa and the second sub-pixel PXb, and the second valley V2 may be positioned between a plurality of pixel columns.

The signal lines 121, 171h, and 171l include a gate line 121 transferring a gate signal, and a first data line 171h and a second data line 171l transferring different data voltages.

A first switching element Qh connected to the gate line 121 and the first data line 171h is formed, and a second switching element Ql connected to the gate line 121 and the second data line 171l is formed.

A first liquid crystal capacitor Clch connected to the first switching element Qh is formed in the first sub-pixel PXa, and a second liquid crystal capacitor Clcl connected to the second switching element Ql is formed in the second sub-pixel PXb.

A first terminal of the first switching element Qh is connected to the gate line 121, a second terminal thereof is connected to the first data line 171h, and a third terminal thereof is connected to the first liquid crystal capacitor Clch.

A first terminal of the second switching element Ql is connected to the gate line 121, a second terminal thereof is connected to the second data line 171l, and a third terminal thereof is connected to the second liquid crystal capacitor Clcl.

Reviewing an operation of the liquid crystal display according to the exemplary embodiment, if a gate-on voltage is applied to the gate line 121, the first switching element Qh and the second switching element Ql connected thereto are turned-on, and the first and second liquid crystal capacitors Clch and Clcl are charged by the different data voltages transferred through the first and second data lines 171h and 171l. The data voltage transferred by the second data line 171l is lower than the data voltage transferred by the first data line 171h. Accordingly, the second liquid crystal capacitor Clcl may be charged by the voltage that is lower than that of the first liquid crystal capacitor Clch to improve lateral visibility.

Hereinafter, the structure of one pixel of the liquid crystal display according to the exemplary embodiment will be described with additional reference to FIG. 3, FIG. 4 and FIG. 5.

Figure 3:
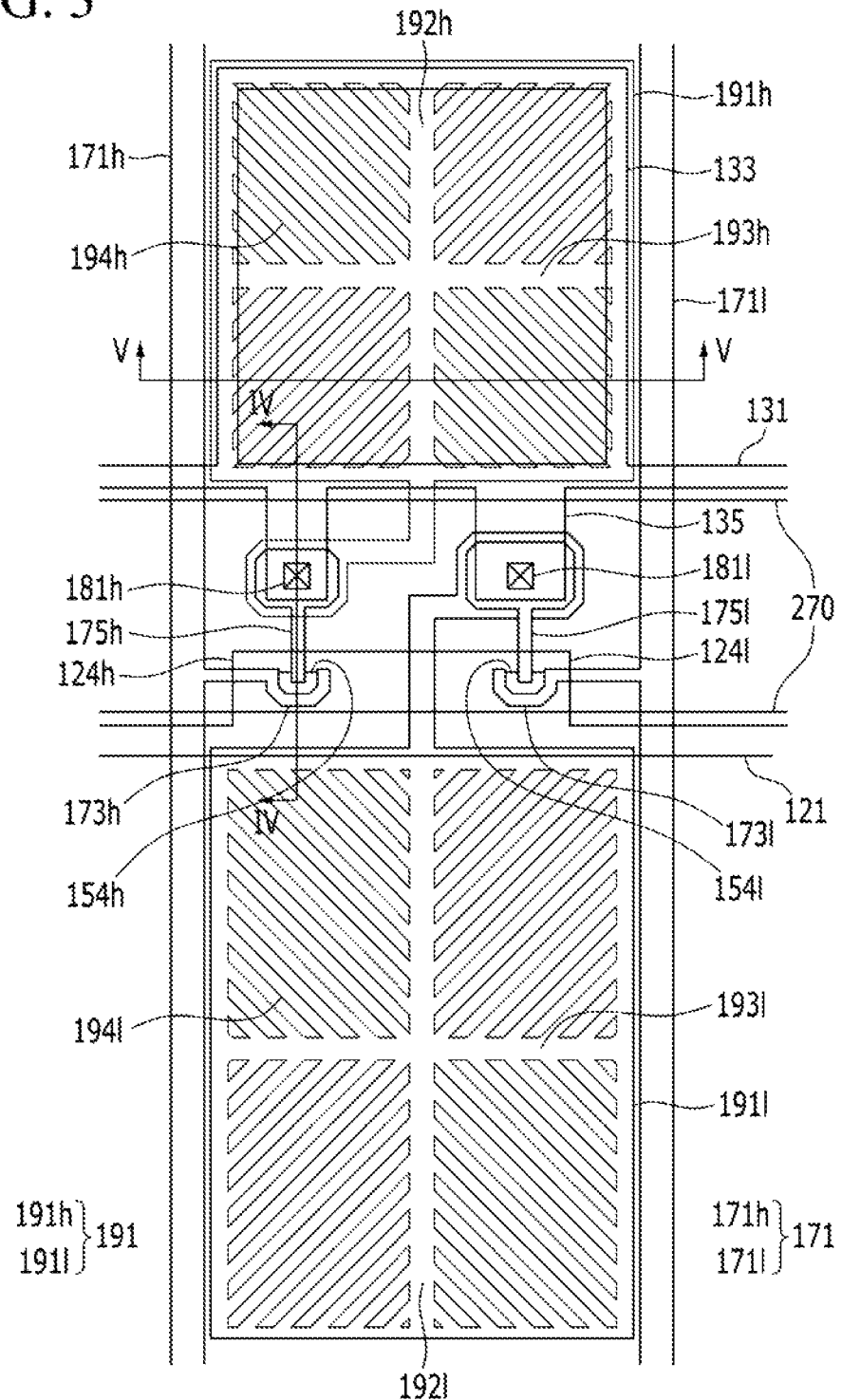
FIG. 3 is a layout view illustrating a portion of the display device according to an exemplary embodiment.
Figure 4:
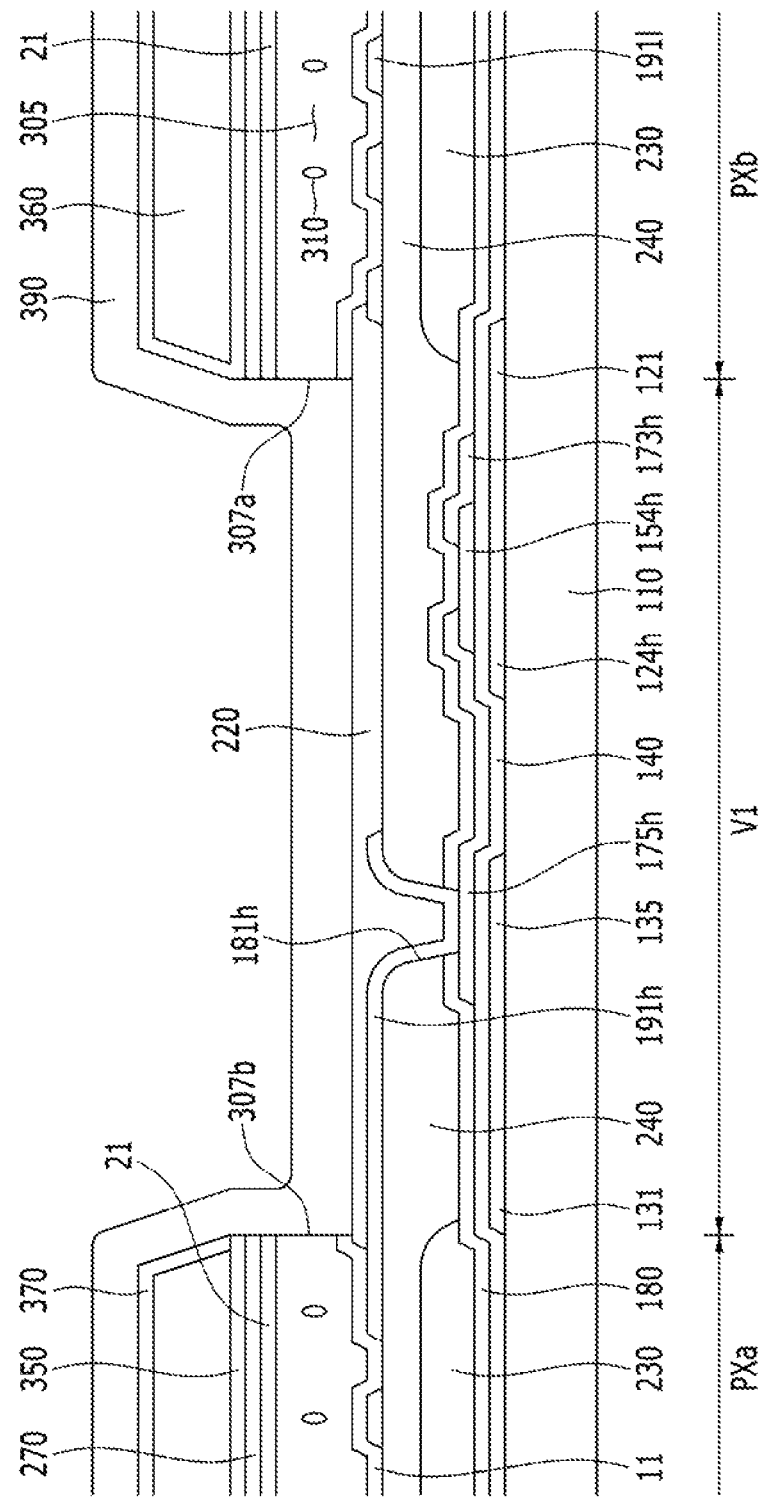
FIG. 4 is a cross-sectional view of the display device according to an exemplary embodiment, which is taken along line IV-IV of FIG. 3.
Figure 5:
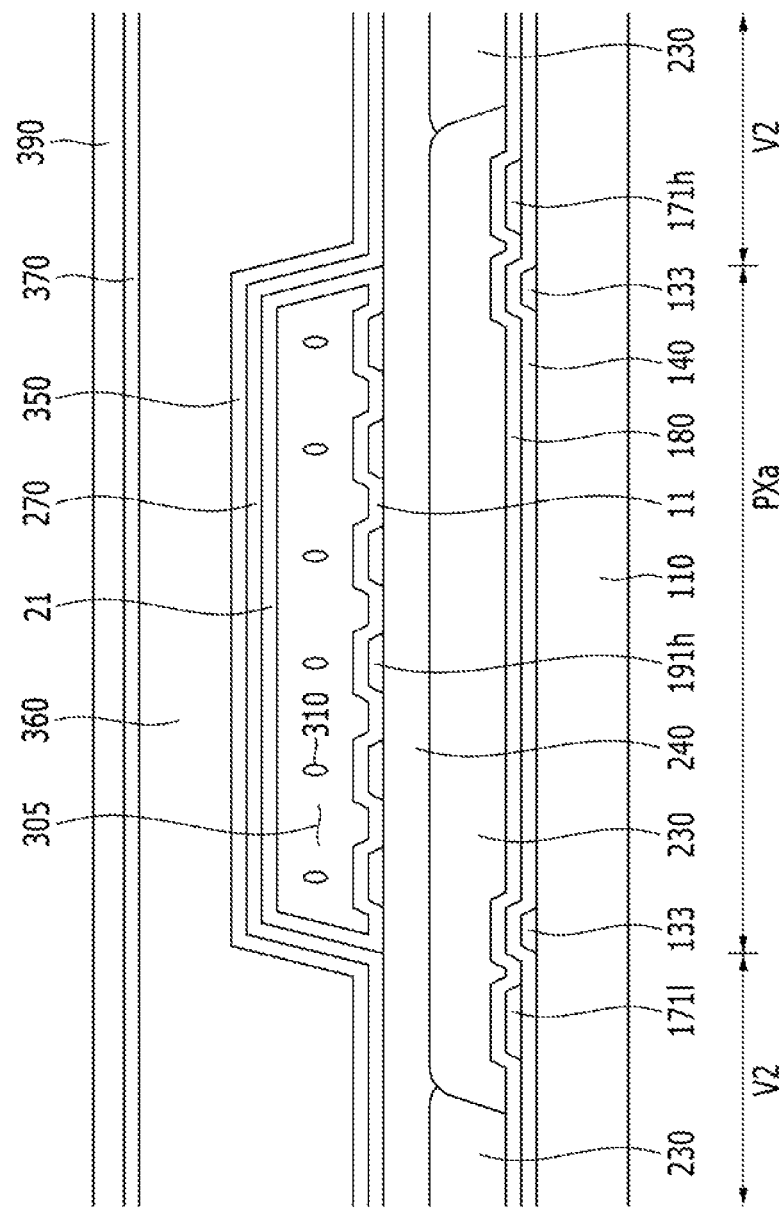
FIG. 5 is a cross-sectional view of the display device according to an exemplary embodiment, which is taken along line V-V of FIG. 3.
Figure 6:
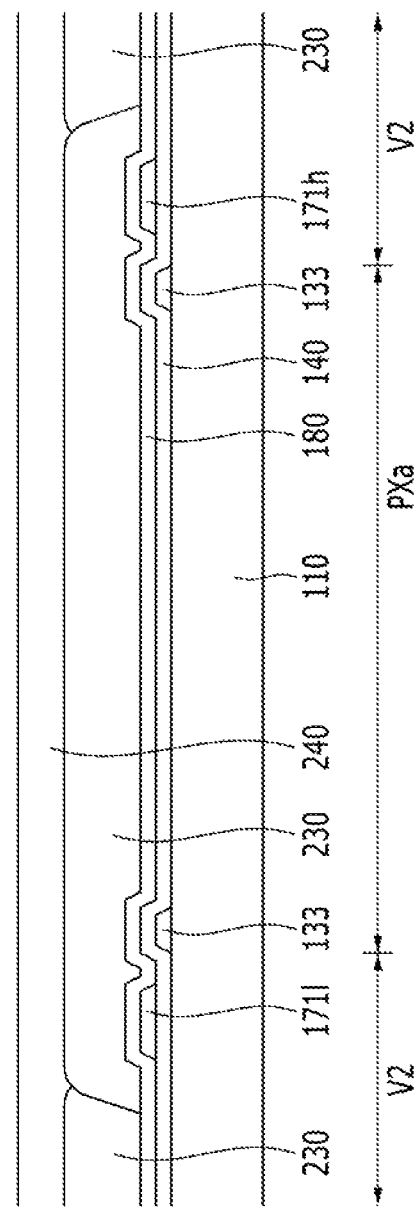
FIG. 6, FIG. 7, FIG. 8, FIG. 9 and FIG. 10 are process cross-sectional views illustrating a method of manufacturing the display device according to an exemplary embodiment.

FIG. 3 is a layout view illustrating a portion of the display device according to an exemplary embodiment, FIG. 4 is a cross-sectional view of the display device according to an exemplary embodiment, which is taken along line IV-IV of FIG. 3, and FIG. 5 is a cross-sectional view of the display device according to an exemplary embodiment, which is taken along line V-V of FIG. 3.

Referring to FIG. 3, FIG. 4 and FIG. 5, the gate line 121 and a first gate electrode 124h and a second gate electrode 124l protruding from the gate line 121 are formed on the substrate 110.

The gate line 121 extends in a first direction, and transfers a gate signal. The gate line 121 is positioned between the two microcavities 305 adjacent in a column direction. That is, the gate line 121 is positioned in the first valley V1. The first gate electrode 124h and the second gate electrode 124l protrude to an upper side of the gate line 121 on the top plan view. The first gate electrode 124h and the second gate electrode 124l may be connected to each other to form one protrusion portion. However, embodiments are not limited thereto, and protrusion shapes of the first gate electrode 124h and the second gate electrode 124l can be variously modified.

A storage electrode line 131 and storage electrodes 133 and 135 protruding from the storage electrode line 131 may be further formed on the substrate 110.

The storage electrode line 131 extends in a direction that is parallel with the gate line 121, and is formed to be spaced apart from the gate line 121. A predetermined voltage may be applied to the storage electrode line 131. The storage electrode 133 protruding over the storage electrode line 131 is formed to surround the edge of the first sub-pixel PXa. The storage electrode 135 protruding down the storage electrode line 131 is formed to be adjacent to the first gate electrode 124h and the second gate electrode 124l.

A gate insulating layer 140 is formed on the gate line 121, the first gate electrode 124h, the second gate electrode 124l, the storage electrode line 131, and the storage electrodes 133 and 135. The gate insulating layer 140 may be formed of an inorganic insulating material such as silicon nitride ($SiN_x$) and silicon oxide ($SiO_x$). Further, the gate insulating layer 140 may be formed of a single layer or a multilayer.

A first semiconductor 154h and a second semiconductor 154l are formed on the gate insulating layer 140. The first semiconductor 154h may be positioned on the first gate electrode 124h, and the second semiconductor 154l may be positioned on the second gate electrode 124l. The first semiconductor 154h may be formed beneath the first data line 171h, and the second semiconductor 154l may be formed beneath the second data line 171l. The first semiconductor 154h and the second semiconductor 154l may be formed of amorphous silicon, polycrystalline silicon, metal oxide, or the like.

Ohmic contact members (not illustrated) may be further formed on the first semiconductor 154h and the second semiconductor 154l, respectively. The ohmic contact members may be made of a material such as silicide or n+ hydrogenated amorphous silicon to which an n-type impurity is doped at a high concentration.

The first data line 171h, the second data line 171l, a first source electrode 173h, a first drain electrode 175h, a second source electrode 173l, and a second drain electrode 175l are formed on the first semiconductor 154h, the second semiconductor 154l, and the gate insulating layer 140.

The first data line 171h and the second data line 171l, sometimes collectively or individually referred to as a data line 171, transfer the data signal, and extend in a second direction to cross the gate line 121 and the storage electrode line 131. The data line 171 is positioned between the two microcavities 305 adjacent in a row direction. That is, the data line 171 is positioned in the second valley V2.

The first data line 171h and the second data line 171l transfer the different data voltages. For example, the data voltage transferred by the second data line 171l is lower than the data voltage transferred by the first data line 171h.

The first source electrode 173h is formed to protrude from the first data line 171h over the first gate electrode 124h, and the second source electrode 173l is formed to protrude from the second data line 171l over the second gate electrode 124l. Each of the first drain electrode 175h and the second drain electrode 175l includes one wide end portion and the other rod-shaped end portion. The wide end portions of the first drain electrode 175h and the second drain electrode 175l overlap with the storage electrode 135 protruding down the storage electrode line 131. The rod-shaped end portions of the first drain electrode 175h and the second drain electrode 175l are partially surrounded by the first source electrode 173h and the second source electrode 173l, respectively.

The first and second gate electrodes 124h and 124l, the first and second source electrodes 173h and 173l, and the first and second drain electrodes 175h and 175l form first and second thin film transistors (TFT) Qh and Ql together with the first and second semiconductors 154h and 154l. A channel of the first and second thin film transistors Qh and Ql is formed in each of the semiconductors 154h and 154l between each of the source electrodes 173h and 173l and each of the drain electrodes 175h and 175l.

A passivation layer 180 is formed on the first data line 171h, the second data line 171l, the first source electrode 173h, the first drain electrode 175h, the first semiconductor 154h exposed between the first source electrode 173h and the first drain electrode 175h, the second source electrode 173l, the second drain electrode 175l, and the second semiconductor 154l exposed between the second source electrode 173l and the second drain electrode 175l. The passivation layer 180 may be formed of an organic insulating material or the inorganic insulating material, and formed of a single layer or a multilayer.

A color filter 230 is formed in each pixel PX on the passivation layer 180.

Each color filter 230 may display any one of primary colors such as three primary colors of red, green, and blue colors. The color filter 230 is not limited to the three primary colors of red, green and blue colors, and may display cyan, magenta, yellow, and white-based colors.

The color filter 230 may not be formed in the first valley V1. The adjacent color filters 230 displaying different colors may overlap with each other in the second valley V2.

A first insulating layer 240 may be further formed on the color filter 230. The first insulating layer 240 may be formed of the organic insulating material, and may serve to planarize the color filters 230.

A first contact hole 181h which extends to and through which the wide end portion of the first drain electrode 175h is exposed and a second contact hole 181l which extends to and through which the wide end portion of the second drain electrode 175l is exposed are formed in the passivation layer 180 and the first insulating layer 240.

A pixel electrode 191 is formed on the first insulating layer 240. The pixel electrode 191 may be formed of a transparent metal material such as indium tin oxide (ITO) and indium zinc oxide (IZO).

The pixel electrode 191 includes a first sub-pixel electrode 191h and a second sub-pixel electrode 191l separated from each other while the gate line 121 and the storage electrode line 131 are interposed therebetween. The first sub-pixel electrode 191h and the second sub-pixel electrode 191l are disposed on and beneath the pixel PX based on the gate line 121 and the storage electrode line 131. That is, the first sub-pixel electrode 191h and the second sub-pixel electrode 191l are separated from each other while the first valley V1 is interposed therebetween, the first sub-pixel electrode 191h is positioned in the first sub-pixel PXa, and the second sub-pixel electrode 191l is positioned in the second sub-pixel PXb.

The first sub-pixel electrode 191h is connected through the first contact hole 181h to the first drain electrode 175h, and the second sub-pixel electrode 191l is connected through the second contact hole 181l to the second drain electrode 175l. Accordingly, when the first thin film transistor Qh and the second thin film transistor Ql are in an on state, the first sub-pixel electrode 191h and the second sub-pixel electrode 191l receive the different data voltages from the first drain electrode 175h and the second drain electrode 175l, respectively.

An entire shape of each of the first sub-pixel electrode 191h and the second sub-pixel electrode 191l is a quadrangle, and the first sub-pixel electrode 191h and the second sub-pixel electrode 191l include cross-shaped stem portions formed of horizontal stem portions 193h and 193l and vertical stem portions 192h and 192l crossing the horizontal stem portions 193h and 193l. Further, the first sub-pixel electrode 191h and the second sub-pixel electrode 191l include a plurality of fine branch portions 194h and 194l.

The pixel electrode 191 is divided into four sub-regions by the horizontal stem portions 193h and 193l and the vertical stem portions 192h and 192l. The fine branch portions 194h and 194l obliquely extend from the horizontal stem portions 193h and 193l and the vertical stem portions 192h and 192l, and the extension direction thereof may form an angle of approximately 45° or 135° with the gate line 121 or the horizontal stem portions 193h and 193l. Further, the extension directions of the fine branch portions 194h and 194l of the two adjacent sub-regions may be orthogonal to each other.

In the present exemplary embodiment, the first sub-pixel electrode 191h and the second sub-pixel electrode 191l may further include outskirt stem portions surrounding outskirts of the first sub-pixel PXa and the second sub-pixel PXb.

The aforementioned disposal type of the pixels, the structure of the thin film transistor, and the shape of the pixel electrode are just an example, the embodiments are not limited thereto, and various modifications are feasible.

A light blocking member 220 is formed on the pixel electrode 191 and the first insulating layer 240. The light blocking member 220 is formed of a material that can block light, and thus may serve to prevent light leakage.

The light blocking member 220 is positioned in the first valley V1. The thin film transistors Qh and Ql are positioned in the first valley V1, and the light blocking member 220 is formed to overlap with the thin film transistors Qh and Ql. Moreover, the light blocking member 220 may be formed to further overlap with the gate line 121 and the storage electrode line 131. Particularly, the light blocking member 220 is formed to cover the first contact hole 181h and the second contact hole 181*l* formed for connection of the thin film transistors Qh and Ql and the pixel electrode 191.

An inorganic insulating layer for protecting the first insulating layer 240 may be further formed on the first insulating layer 240, and an inorganic insulating layer for protecting the light blocking member 220 may be further formed on the light blocking member 220. However, in the present exemplary embodiment, since there is little concern about damage to the first insulating layer 240 and the light blocking member 220, this inorganic insulating layer may not be formed. Accordingly, in the present exemplary embodiment, the pixel electrode 191 is formed directly on the first insulating layer 240. Further, the light blocking member 220 is positioned directly beneath an encapsulation layer 390 as will be described later.

A common electrode 270 is formed on the pixel electrode 191 to be spaced apart from the pixel electrode 191 by a predetermined distance. A microcavity 305 is formed between the pixel electrode 191 and the common electrode 270. That is, the microcavity 305 is surrounded by the pixel electrode 191 and the common electrode 270. The common electrode 270 is formed in a row direction, and is formed on the microcavity 305 and in the second valley V2. The common electrode 270 is formed to cover an upper surface and a lateral surface of the microcavity 305. A width and an area of the microcavity 305 may be variously modified according to a size and a resolution of the display device.

However, the embodiments are not limited thereto, and the common electrode 270 may be formed while the insulating layer is interposed between the common electrode 270 and the pixel electrode 191. In this case, the microcavity 305 is not formed between the pixel electrode 191 and the common electrode 270, but the microcavity 305 may be formed on the common electrode 270.

The common electrode 270 may be formed of a transparent metal material such as indium tin oxide (ITO) and indium zinc oxide (IZO). A predetermined voltage may be applied to the common electrode 270, and an electric field may be formed between the pixel electrode 191 and the common electrode 270.

Alignment layers 11 and 21 are formed on the pixel electrode 191 and beneath the common electrode 270.

The alignment layers 11 and 21 include a photosensitive material. The photosensitive material is a material causing a chemical change if light is irradiated thereon, and is formed of a photosensitive resin such as a PAC (photoactive compound), a PAG (photoacid generator), and a photoinitiator. The photosensitive resin is reacted with light to cause a change of dissolution or solidification. The photosensitive resin where a polymer at a portion which light reaches is insolubilized and a resist remains is called a negative type photoresist, and the photosensitive resin where the polymer at the portion which light reaches is solubilized and the resist is removed is called a positive type photoresist.

The PAC has the following structure of Chemical Formula 1. Accordingly, the alignment layers 11 and 21 may include a sulfur component and a chlorine component.

[Chemical Formula 1]

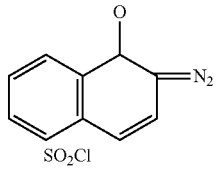

The alignment layers 11 and 21 have a form where various kinds of side chain groups are attached to a main chain, and form a pretilt to control arrangement of liquid crystals. The main chains and the side chain groups of the alignment layers 11 and 21 may have the following structure of Chemical Formula 2.

[Chemical Formula 2]

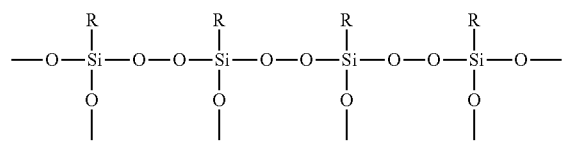

The alignment layers 11 and 21 further include a siloxane resin, and the main chain may be formed of siloxane. Siloxane has a chain type structure where silicon atoms and oxygen atoms are alternately bonded. A reaction group R is bonded to siloxane, and the reaction group R may form the side chain group. The reaction group R may be formed of an alkyl group, a methyl group, or the like.

The alignment layers 11 and 21 include the first alignment layer 11 and the second alignment layer 21. The first and second alignment layers 11 and 21 may be connected at a lateral wall of an edge of the microcavity 305.

The first alignment layer 11 is formed on the pixel electrode 191. The first alignment layer 11 may be formed directly on the first insulating layer 240 not covered by the pixel electrode 191.

The second alignment layer 21 is formed beneath the common electrode 270 to face the first alignment layer 11.

A liquid crystal layer formed of liquid crystal molecules 310 is formed in the microcavity 305 positioned between the pixel electrode 191 and the common electrode 270. The liquid crystal molecules 310 have negative dielectric anisotropy, and may be erected in a vertical direction to the substrate 110 in a state where the electric field is not applied. That is, vertical alignment may be obtained.

The first sub-pixel electrode 191*h* and the second sub-pixel electrode 191*l* to which the data voltage is applied generate an electric field together with the common electrode 270 to determine a direction of the liquid crystal molecules 310 positioned in the microcavity 305 between the two electrodes 191 and 270. Luminance of light passing through the liquid crystal layer is changed according to the thus determined direction of the liquid crystal molecules 310.

A second insulating layer 350 may be further formed on the common electrode 270. The second insulating layer 350 may be formed of the inorganic insulating material such as silicon nitride (SiNx) and silicon oxide (SiOx), and may be omitted if necessary.

The roof layer 360 is formed on the second insulating layer 350. The roof layer 360 may be formed of an organic material. The roof layer 360 is formed in a row direction, and is formed on the microcavity 305 and in the second valley V2. The roof layer 360 is formed to cover an upper surface and a lateral surface of the microcavity 305. The roof layer 360 may be hardened by a curing process to maintain a shape of the microcavity 305. The roof layer 360 is formed to be spaced apart from the pixel electrode 191 while the microcavity 305 is interposed between the roof layer 360 and the pixel electrode 191.

The common electrode 270 and the roof layer 360 are formed to expose the lateral surface of the edge of the microcavity 305, and portions where the microcavity 305 is not covered by the common electrode 270 and the roof layer 360 are called the injection holes 307a and 307b. The injection holes 307a and 307b include the first injection hole 307a which extends to and through which the lateral surface of the first edge of the microcavity 305 is exposed, and the second injection hole 307b which extends to and through which the lateral surface of the second edge of the microcavity 305 is exposed. The first edge and the second edge are the edges facing each other, and for example, on the top plan view, the first edge may be an upper edge of the microcavity 305 and the second edge may be a lower edge of the microcavity 305. Since the microcavity 305 is exposed by the injection holes 307a and 307b, an aligning agent, a liquid crystal material, or the like may be injected through the injection holes 307a and 307b into the microcavity 305.

A third insulating layer 370 may be further formed on the roof layer 360. The third insulating layer 370 may be formed of the inorganic insulating material such as silicon nitride (SiNx) and silicon oxide (SiOx). The third insulating layer 370 may be formed to cover an upper surface and a lateral surface of the roof layer 360. The third insulating layer 370 serves to protect the roof layer 360 formed of an organic material, and may be omitted if necessary.

The encapsulation layer 390 is formed on the third insulating layer 370. The encapsulation layer 390 is formed to cover the injection holes 307a and 307b through which a portion of the microcavity 305 is exposed to the outside. That is, the encapsulation layer 390 may seal the microcavity 305 so that the liquid crystal molecules 310 formed in the microcavity 305 are not discharged to the outside. Since the encapsulation layer 390 is in contact with the liquid crystal molecules 310, it is preferable that the encapsulation layer 390 be formed of a material not reacted with the liquid crystal molecules 310. For example, the encapsulation layer 390 may be formed of parylene or the like.

As described above, the encapsulation layer 390 is formed directly on the light blocking member 220 in the first valley V1.

The encapsulation layer 390 may be formed of a multilayer such as a double layer or a triple layer. The double layer is formed of two layers formed of different materials. The triple layer is formed of three layers, and materials of the adjacent layers are different from each other. For example, the encapsulation layer 390 may include a layer formed of the organic insulating material and a layer formed of the inorganic insulating material.

Although not illustrated in the drawings, a polarizer may be further formed on upper and lower surfaces of the display device. The polarizer may be formed of a first polarizer and a second polarizer. The first polarizer may be attached to a lower surface of the substrate 110, and the second polarizer may be attached onto the encapsulation layer 390.

Hereinafter, a method of manufacturing the display device according to the exemplary embodiment will be described below with reference to FIG. 6, FIG. 7, FIG. 8, FIG. 9 and FIG. 10. Moreover, a description will be given with reference to FIG. 1, FIG. 2, FIG. 3, FIG. 4 and FIG. 5 together.

FIG. 6, FIG. 7, FIG. 8, FIG. 9 and FIG. 10 are process cross-sectional views illustrating the method of manufacturing the display device according to the exemplary embodiment.

First, as illustrated in FIGS. 1-6, the gate line 121 extending in a first direction, and the first gate electrode 124h and the second gate electrode 124l protruding from the gate line 121 are formed on the substrate 110 formed of glass, plastic, or the like. The first gate electrode 124h and the second gate electrode 124l may be connected to each other to form one protrusion portion.

Further, the storage electrode line 131 and the storage electrodes 133 and 135 protruding from the storage electrode line 131 may be formed together to be spaced apart from the gate line 121. The storage electrode line 131 extends in a direction that is parallel to the gate line 121. The storage electrode 133 protruding over the storage electrode line 131 is formed to surround an edge of a first sub-pixel region PXa, and the storage electrode 135 protruding down the storage electrode line 131 may be formed to be adjacent to the first gate electrode 124h and the second gate electrode 124l.

Subsequently, the gate insulating layer 140 is formed by using the inorganic insulating material such as silicon nitride (SiNx) and silicon oxide (SiOx) on the gate line 121, the first gate electrode 124h, the second gate electrode 124l, the storage electrode line 131, and the storage electrodes 133 and 135. The gate insulating layer 140 may be formed of a single layer or a multilayer.

Subsequently, a semiconductor material such as amorphous silicon, polycrystalline silicon, or metal oxide is deposited on the gate insulating layer 140, and then patterned to form the first semiconductor 154h and the second semiconductor 154l. The first semiconductor 154h may be formed to be positioned on the first gate electrode 124h, and the second semiconductor 154l may be formed to be positioned on the second gate electrode 124l.

Subsequently, the metal material is deposited, and then patterned to form the first data line 171h and the second data line 171l extending in a second direction. The metal material may be formed of a single layer or a multilayer.

Further, the first source electrode 173h protruding from the first data line 171h over the first gate electrode 124h, and the first drain electrode 175h spaced apart from the first source electrode 173h are formed together. Further, the second source electrode 173l protruding from the second data line 171l over the second gate electrode 124l, and the second drain electrode 175l spaced apart from the second source electrode 173l are formed together.

The semiconductor material and the metal material may be continuously deposited, and then simultaneously patterned to form the first and second semiconductors 154h and 154l, the first and second data lines 171h and 171l, the first and second source electrodes 173h and 173l, and the first and second drain electrodes 175h and 175l. In this case, the first semiconductor 154h is formed beneath the first data line 171h, and the second semiconductor 154l is formed beneath the second data line 171l.

The first and second gate electrodes 124h and 124l, the first and second source electrodes 173h and 173l, and the first and second drain electrodes 175h and 175l constitute the first and second thin film transistors (TFT) Qh and Ql together with the first and second semiconductors 154h and 154l.

Subsequently, the passivation layer 180 is formed on the first data line 171h, the second data line 171l, the first source electrode 173h, the first drain electrode 175h, the first semiconductor 154h exposed between the first source electrode 173h and the first drain electrode 175h, the second source electrode 173l, the second drain electrode 175l, and the second semiconductor 154l exposed between the second source electrode 173l and the second drain electrode 175l. The passivation layer 180 may be formed of the organic insulating material or the inorganic insulating material, and formed of a single layer or a multilayer.

Subsequently, the color filter 230 is formed on the passivation layer 180. The color filter 230 may be formed in the first sub-pixel PXa and the second sub-pixel PXb, but may not be formed in the first valley V1. The color filters 230 having the same color may be formed in a column direction of a plurality of pixel regions PX. In the case where the color filters 230 having three colors are formed, after the color filter 230 having a first color is first formed, the color filter 230 having a second color may be formed by shifting a mask. Subsequently, after the color filter 230 having the second color is formed, the color filter having a third color may be formed by shifting the mask.

Subsequently, the first insulating layer 240 is formed of the organic insulating material on the color filter 230.

By patterning the passivation layer 180 and the first insulating layer 240, the first contact hole 181h is formed to extend to and expose at least a portion of the first drain electrode 175h and the second contact hole 181l is formed to extend to and expose at least a portion of the second drain electrode 175l.

Figure 7:
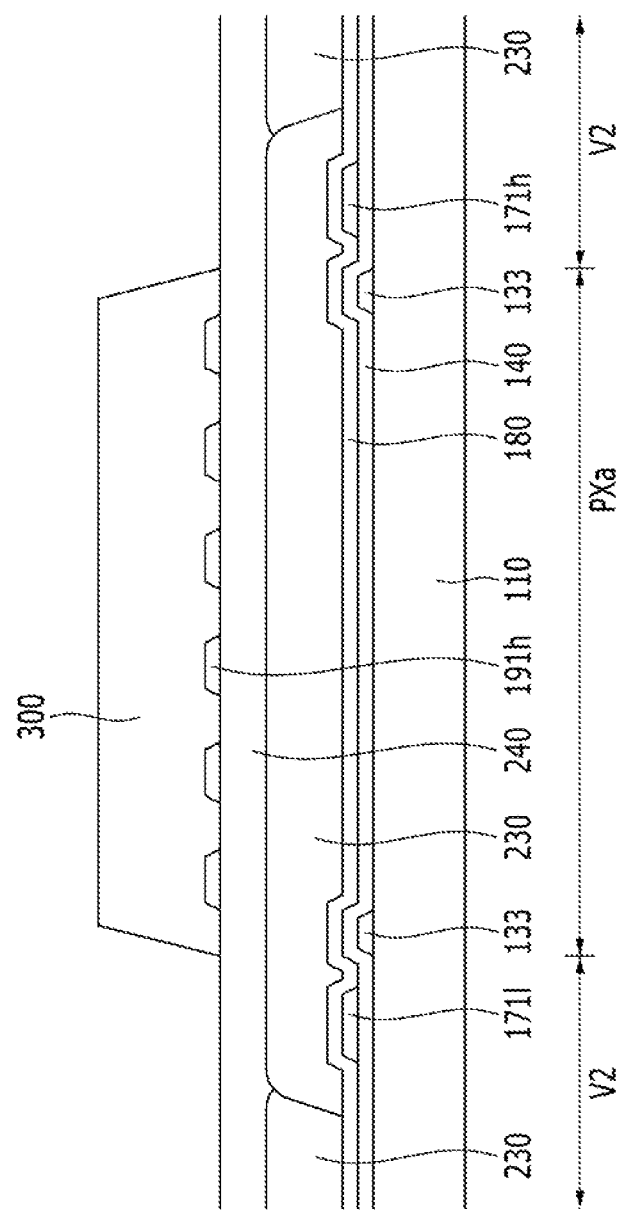

As illustrated in FIG. 7, a transparent metal material such as indium tin oxide (ITO) and indium zinc oxide (IZO) is deposited on the first insulating layer 240, and then patterned to form the pixel electrode 191 in the pixel region PX. The pixel electrode 191 includes the first sub-pixel electrode 191h positioned in the first sub-pixel region PXa and the second sub-pixel electrode 191l positioned in the second sub-pixel region PXb. The first sub-pixel electrode 191h and the second sub-pixel electrode 191l may be positioned to be spaced apart from each other while the first valley V1 is interposed therebetween.

The horizontal stem portions 193h and 193l, and the vertical stem portions 192h and 192l crossing the horizontal stem portions 193h and 193l are formed in the first sub-pixel electrode 191h and the second sub-pixel electrode 191l. Further, the plurality of fine branch portions 194h and 194l obliquely extending from the horizontal stem portions 193h and 193l and the vertical stem portions 192h and 192l are formed.

Subsequently, the light blocking member 220 is formed on the pixel electrode 191 and the first insulating layer 240 by using a material that can block light.

The light blocking member 220 is positioned in the first valley V1. The thin film transistors Qh and Ql are positioned in the first valley V1, and the light blocking member 220 is formed to overlap with the thin film transistors Qh and Ql. Moreover, the light blocking member 220 may be formed to further overlap with the gate line 121 and the storage electrode line 131. Particularly, the light blocking member 220 is formed to cover the first contact hole 181h and the second contact hole 181l formed for connection of the thin film transistors Qh and Ql and the pixel electrode 191.

Subsequently, a sacrificial layer 300 is formed on the pixel electrode 191 and the first insulating layer 240. The sacrificial layer 300 may be formed in a column direction. The sacrificial layer 300 may be formed in each pixel PX and the first valley V1, but may not be formed in the second valley V2.

The sacrificial layer 300 includes a photosensitive material, a siloxane resin, and a reaction group.

The photosensitive material is a material causing a chemical change if light is irradiated thereon, and is formed of a photosensitive resin such as a PAC (photoactive compound), a PAG (photoacid generator), and a photoinitiator. The photosensitive resin is reacted with light to cause a change of dissolution or solidification. The photosensitive resin where a polymer at a portion which light reaches is insolubilized and a resist remains is called a negative type photoresist, and the photosensitive resin where the polymer at the portion which light reaches is solubilized and the resist is removed is called a positive type photoresist.

The PAC has the following structure of Chemical Formula 1. Accordingly, the alignment layers 11 and 21 include a sulfur component and a chlorine component.

[Chemical Formula 1]

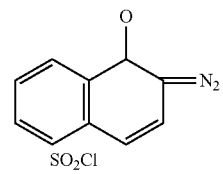

The siloxane resin and the reaction group have the following structure of Chemical Formula 2. Siloxane has a chain type structure where silicon atoms and oxygen atoms are alternately bonded, and forms a main chain. A reaction group R is bonded to siloxane, and the reaction group R may form a side chain group. The reaction group R may be formed of an alkyl group, a methyl group, or the like.

[Chemical Formula 2]

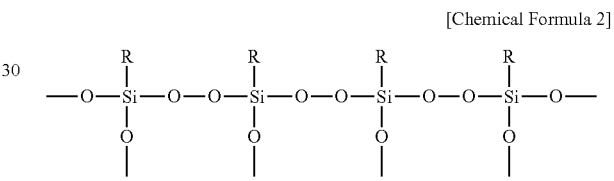

Figure 8:
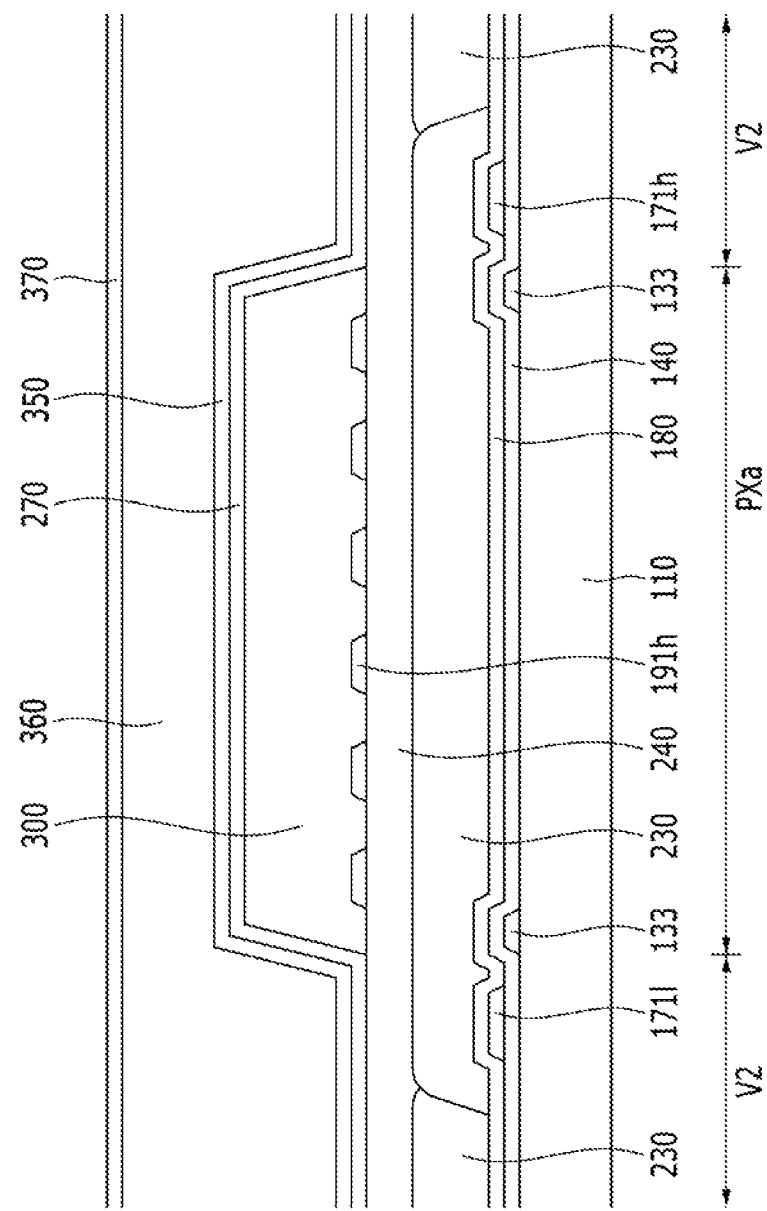

As illustrated in FIG. 8, a transparent metal material such as indium tin oxide (ITO) and indium zinc oxide (IZO) is deposited on the sacrificial layer 300 to form the common electrode 270.

Subsequently, the second insulating layer 350 may be formed of the inorganic insulating material such as silicon oxide or silicon nitride on the common electrode 270.

Subsequently, the roof layer 360 is formed by applying the organic material on the second insulating layer 350 and performing patterning. In this case, patterning may be performed to remove the organic material positioned in the first valley V1. Accordingly, the roof layer 360 is formed to be connected along the plurality of pixel rows. After the roof layer 360 is patterned, light is irradiated on the roof layer 360 to perform a curing process. If the curing process is performed, the roof layer 360 is hardened, so that even though a space is formed beneath the roof layer 360, a shape thereof may be maintained.

Subsequently, the second insulating layer 350 and the common electrode 270 are patterned by using the roof layer 360 as the mask to remove the second insulating layer 350 and the common electrode 270 positioned in the first valley V1.

Subsequently, the third insulating layer 370 may be formed of the inorganic insulating material such as silicon nitride (SiNx) and silicon oxide (SiOx) on the roof layer 360. The third insulating layer 370 positioned in the first valley V1 is removed by patterning the third insulating layer 370.

The sacrificial layer 300 positioned in the first valley V1 is exposed to the outside by patterning the roof layer 360, the second insulating layer 350, the common electrode 270, and the third insulating layer 370.

Figure 9:
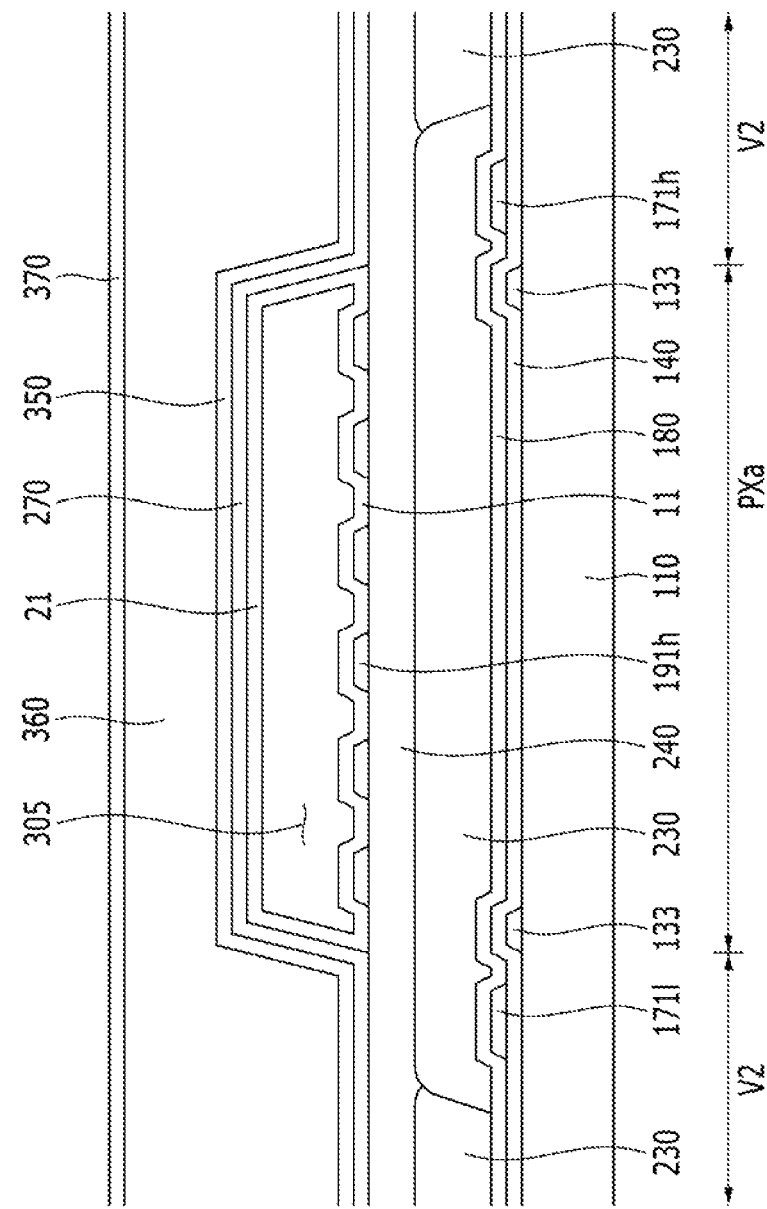

As illustrated in FIG. 9, the sacrificial layer 300 is removed by supplying a developing solution, a stripper solution, or the like onto the substrate 110 in which the sacrificial layer 300 is exposed. The sacrificial layer 300 is reacted with light in the curing process of the roof layer 360 to be partially altered. Accordingly, a portion of the sacrificial layer 300 remains in the process of removing the sacrificial layer 300. In this case, a portion of the sacrificial layer 300, which comes into contact with the pixel electrode 191, and a portion of the sacrificial layer 300, which comes into contact with the common electrode 270, remain.

The sacrificial layer 300 remaining in the process of removing the sacrificial layer 300 becomes the alignment layers 11 and 21. The sacrificial layer 300 includes materials of the photosensitive material, a main chain, and a side chain group. Since the sacrificial layer 300 includes materials of a main chain and a side chain group, the sacrificial layer 300 can control arrangement of liquid crystals.

The alignment layers 11 and 21 include the first alignment layer 11 and the second alignment layer 21. The first alignment layer 11 may be formed on the pixel electrode 191, and the second alignment layer 21 may be formed beneath the common electrode 270. The first alignment layer 11 and the second alignment layer 21 are formed to face each other while the microcavity 305 is interposed therebetween, and are formed to be connected to each other at the lateral wall of the edge of the microcavity 305.

In this case, the first and second alignment layers 11 and 21 may be aligned in a direction that is vertical to the substrate 110 with the exception of the lateral surface of the microcavity 305.

In the present exemplary embodiment, a process of injecting the aligning agent may be omitted by using an altered layer of the sacrificial layer 300 as the alignment layers 11 and 21, and thus the present exemplary embodiment may be simplified. Further, an oxygen ashing process for removing the altered layer of the sacrificial layer 300 may be omitted and thus the present exemplary embodiment may be simplified. Further, since there is no concern about damage to the first insulating layer 240 or the light blocking member 220 due to the oxygen ashing process, it is fine not to form an inorganic insulating layer for protecting the first insulating layer 240 and the light blocking member 220. Accordingly, like this, a process of forming the inorganic insulating layer may be omitted and thus the present exemplary embodiment may be simplified. Accordingly, the pixel electrode 191 is positioned directly on the first insulating layer 240, and the encapsulation layer 390 as will be described later is positioned directly on the light blocking member 220.

If the sacrificial layer 300 is removed, the microcavity 305 is formed at a position in which the sacrificial layer 300 was positioned.

Further, in the case where a process of injecting a separate aligning material is performed in order to form the alignment layers 11 and 21, an agglomeration phenomenon of the alignment layers 11 and 21 occurs in a partial region of the microcavity 305. In the present exemplary embodiment, the agglomeration phenomenon of the alignment layers 11 and 21 may be prevented by forming the sacrificial layer 300 and using a residual portion after removing the sacrificial layer 300 as the alignment layers 11 and 21.

The pixel electrode 191 and the common electrode 270 are spaced apart from each other while the microcavity 305 is interposed therebetween, and the pixel electrode 191 and the roof layer 360 are spaced apart from each other while the microcavity 305 is interposed therebetween. The common electrode 270 and the roof layer 360 are formed to cover an upper surface and both lateral surfaces of the microcavity 305.

Further, the microcavity 305 is exposed to the outside through a portion in which the roof layer 360 and the common electrode 270 are removed, and the portions through which the microcavity 305 is exposed are called the injection holes 307a and 307b. The two injection holes 307a and 307b may be formed in one microcavity 305, and for example, the first injection hole 307a which extends to and through which the lateral surface of the first edge of the microcavity 305 is exposed, and the second injection hole 307b which extends to and through which the lateral surface of the second edge of the microcavity 305 is exposed may be formed. The first edge and the second edge are the edges facing each other, and for example, the first edge may be the upper edge of the microcavity 305 and the second edge may be the lower edge of the microcavity 305.

Figure 10:
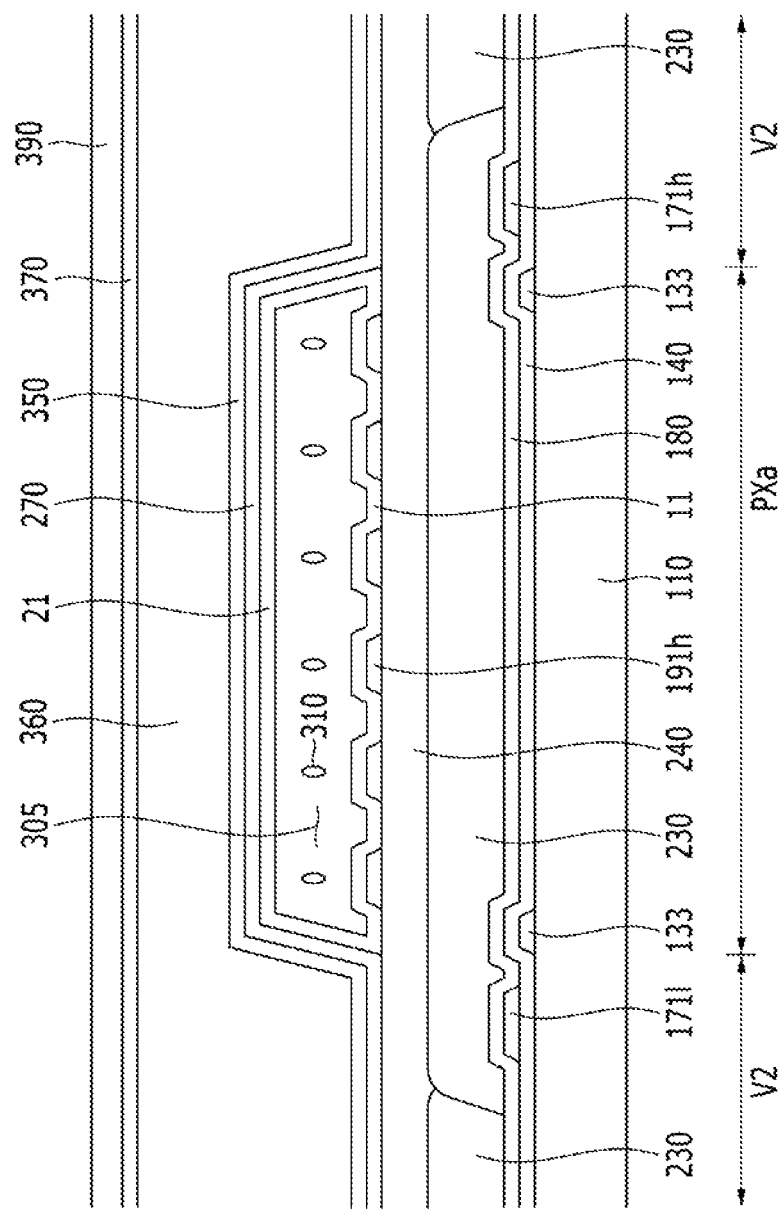

As illustrated in FIG. 10, if the liquid crystal material is dripped on the substrate 110 by an inkjet method or a dispensing method, the liquid crystal material is injected through the injection holes 307a and 307b into the microcavity 305 by capillary force. Accordingly, the liquid crystal layer formed of the liquid crystal molecules 310 is formed in the microcavity 305.

Subsequently, the encapsulation layer 390 is formed by depositing a material that is not reacted with the liquid crystal molecules 310 on the third insulating layer 370. The encapsulation layer 390 is formed to cover the injection holes 307a and 307b and thus seals the microcavity 305 so that the liquid crystal molecules 310 formed in the microcavity 305 are not discharged to the outside.

Subsequently, although not illustrated in the drawings, the polarizer may be further attached to the upper and lower surfaces of the display device. The polarizer may be formed of a first polarizer and a second polarizer. The first polarizer may be attached to the lower surface of the substrate 110 and the second polarizer may be attached onto the encapsulation layer 390.

Hereinafter, in the display device according to the exemplary embodiment, a characteristic that when the altered layer of the sacrificial layer is used as the alignment layer, a pretilt angle is formed without a separate additional process will be described with reference to FIG. 11 and FIG. 12.

Figure 11:
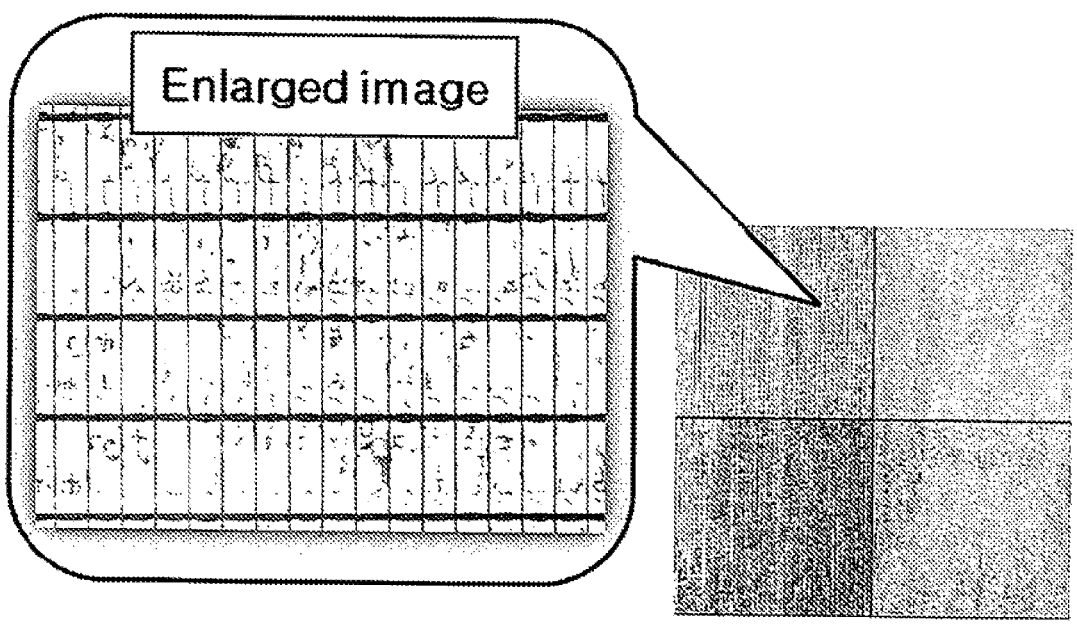
FIG. 11 is a view illustrating the display device where a sacrificial layer is formed by a general photoresist.
Figure 12:
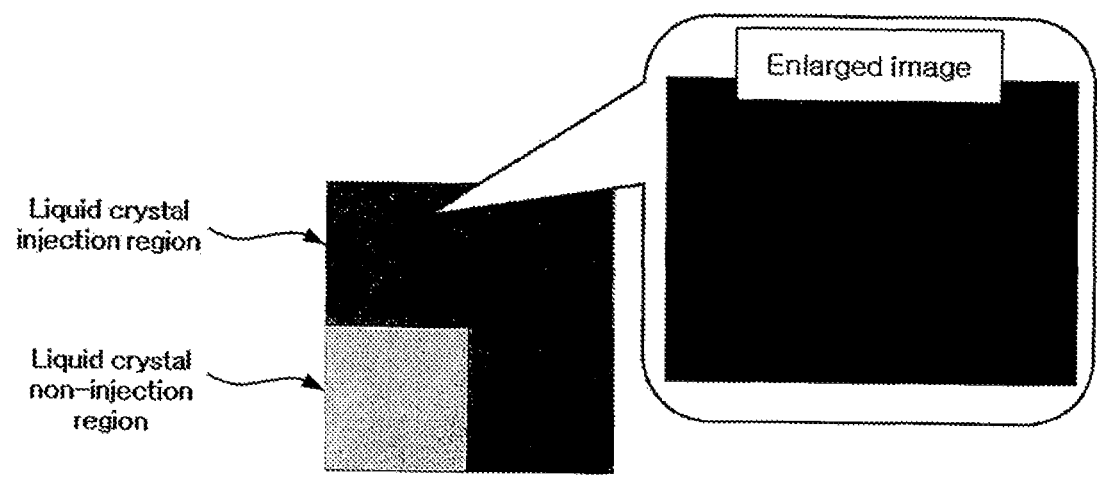
FIG. 12 is a view illustrating the display device according to an exemplary embodiment.

FIG. 11 is a view illustrating the display device where the sacrificial layer is formed by a general photoresist, and FIG. 12 is a view illustrating the display device according to the exemplary embodiment. FIG. 11 and FIG. 12 are results obtained by allowing a transmissive axis of the first polarizer and a transmissive axis of the second polarizer to vertically cross each other, supplying light of a backlight, and observing light passing through the display device.

In the case of FIG. 11, since the general photoresist does not have an alignment characteristic, the liquid crystal molecules do not face in a predetermined direction. Accordingly, it could be observed that light supplied from the backlight goes by the liquid crystal layer and penetrates as it is.

In the case of FIG. 12, in the display device according to the exemplary embodiment, since the sacrificial layer is formed of the photoresist including the alignment material, the display device has the alignment characteristic. Accordingly, the liquid crystal molecules are aligned to have a predetermined pretilt angle. First, reviewing a liquid crystal non-injection region, like FIG. 11, light supplied from the backlight penetrates as it is. Reviewing the liquid crystal injection region, light does not pass through the liquid crystal layer where alignment is performed in a predetermined direction, and a black image is displayed.

Next, the display device according to an exemplary embodiment will be described below with reference to FIG. 13 and FIG. 14.

Figure 13:
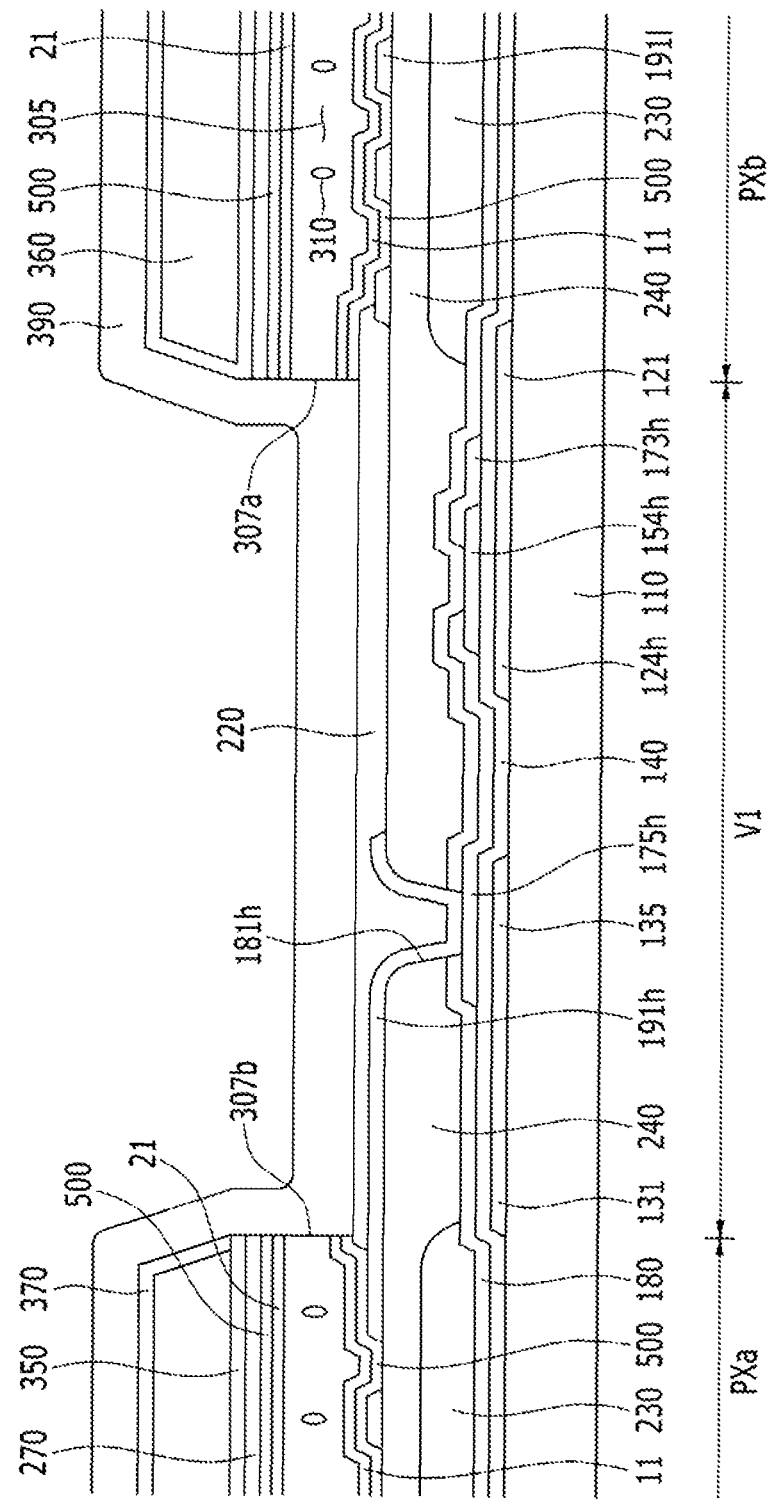
FIG. 13 and FIG. 14 are cross-sectional views illustrating the display device according to an exemplary embodiment.
Figure 14:
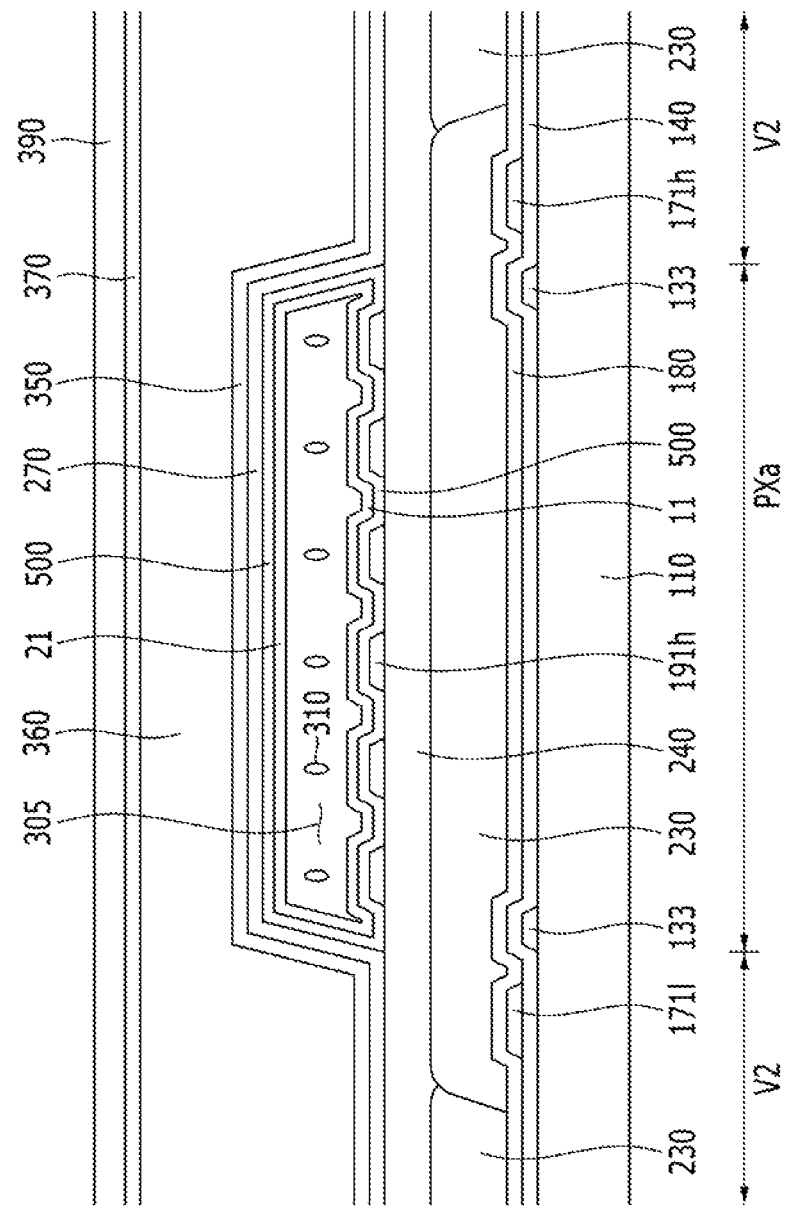

Since the display device according to the exemplary embodiment illustrated in FIG. 13 and FIG. 14 is almost the same as the display device according to the exemplary embodiment illustrated in FIG. 1, FIG. 2, FIG. 3, FIG. 4 and FIG. 5, a description thereof will be omitted. The present exemplary embodiment is different from the former exemplary embodiment in that an alignment layer is separately formed in addition to the altered layer of the sacrificial layer, and hereinafter, will be described in more detail.

FIG. 13 and FIG. 14 are cross-sectional views illustrating the display device according to the exemplary embodiment. FIG. 13 and FIG. 14 are the cross-sectional views obtained by cutting different portions.

The thin film transistor, the pixel electrode 191 connected thereto, and the common electrode 270 spaced apart from the pixel electrode 191 while the microcavity 305 is interposed therebetween are formed on the substrate 110.

The alignment layers 11 and 21 are formed on the pixel electrode 191 and beneath the common electrode 270.

Unlike the former exemplary embodiment, in the present exemplary embodiment, the alignment layers 11 and 21 do not include the photosensitive material. The alignment layers 11 and 21 have a form where various kinds of side chain groups are attached to the main chain, and form the pretilts to control arrangement of the liquid crystals. The main chain may be formed of siloxane, and the side chain group may be formed of a reaction group such as an alkyl group and a methyl group.

The alignment layers 11 and 21 include the first alignment layer 11 and the second alignment layer 21. The first and second alignment layers 11 and 21 may be connected at the lateral wall of the edge of the microcavity 305.

The first alignment layer 11 is formed on the pixel electrode 191, and the second alignment layer 21 is formed beneath the common electrode 270 to face the first alignment layer 11.

An altered layer 500 is further formed between the pixel electrode 191 and the first alignment layer 11, and between the common electrode 270 and the second alignment layer 21.

The altered layer 500 includes the photosensitive material. The photosensitive material is a material causing a chemical change if light is irradiated thereon, and is formed of a PAC (photoactive compound), a PAG (photoacid generator), a photoinitiator, or the like. The PAC has the following structure of Chemical Formula 1. Accordingly, the altered layer 500 includes a sulfur component and a chlorine component.

[Chemical Formula 1]

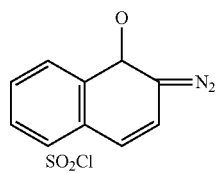

The liquid crystal layer formed of the liquid crystal molecules 310 is formed in the microcavity 305 positioned between the pixel electrode 191 and the common electrode 270, the roof layer 360 is formed on the common electrode 270, and the encapsulation layer 390 sealing the microcavity 305 is formed on the roof layer 360.

Like the former exemplary embodiment, in the present exemplary embodiment, since there is little concern about damage to the first insulating layer 240 and the light blocking member 220, it is fine not to form the inorganic insulating layer for protecting the first insulating layer 240 and the light blocking member 220. Accordingly, the pixel electrode 191 is formed directly on the first insulating layer 240, and the light blocking member 220 is positioned directly beneath the encapsulation layer 390.

Hereinafter, a method of manufacturing the display device according to the exemplary embodiment will be described below with reference to FIG. 15, FIG. 16, FIG. 17 and FIG. 18. Moreover, a description will be given with reference to FIG. 13 and FIG. 14 together.

FIG. 15, FIG. 16, FIG. 17 and FIG. 18 are process cross-sectional views illustrating the method of manufacturing the display device according to the exemplary embodiment.

Figure 15:
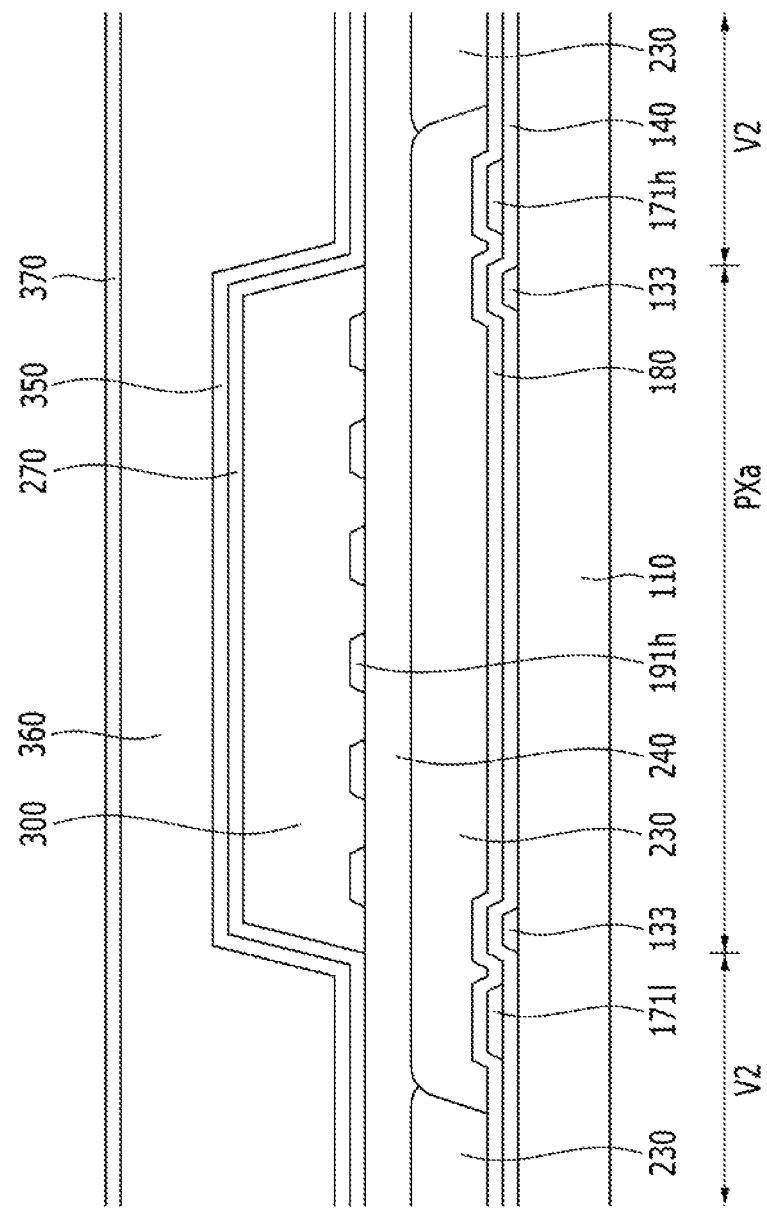
FIG. 15, FIG. 16, FIG. 17 and FIG. 18 are process cross-sectional views illustrating the method of manufacturing the display device according to an exemplary embodiment.

First, as illustrated in FIG. 15, the thin film transistor is formed on the substrate 110, and the pixel electrode 191 is formed to be connected thereto.

The sacrificial layer 300 is formed on the pixel electrode 191. The sacrificial layer 300 may be formed in a column direction. The sacrificial layer 300 may be formed in each pixel PX and the first valley V1, but may not be formed in the second valley V2.

The sacrificial layer 300 includes the photosensitive material. Unlike the former exemplary embodiment, in the present exemplary embodiment, the sacrificial layer 300 does not include the siloxane resin and the reaction group.

The photosensitive material is the material causing the chemical change if light is irradiated thereon, and is formed of the PAC (photoactive compound), the PAG (photoacid generator), the photoinitiator, or the like. The PAC has the following structure of Chemical Formula 1. Accordingly, the sacrificial layer 300 includes a sulfur component and a chlorine component.

[Chemical Formula 1]

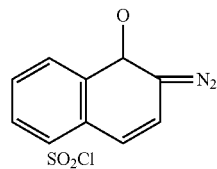

Subsequently, the common electrode 270 is formed on the sacrificial layer 300, the roof layer 360 is formed on the common electrode 270, and the roof layer 360 is then cured.

A portion of the sacrificial layer 300 positioned in the first valley V1 is exposed to the outside by patterning the roof layer 360 and the common electrode 270.

Figure 16:
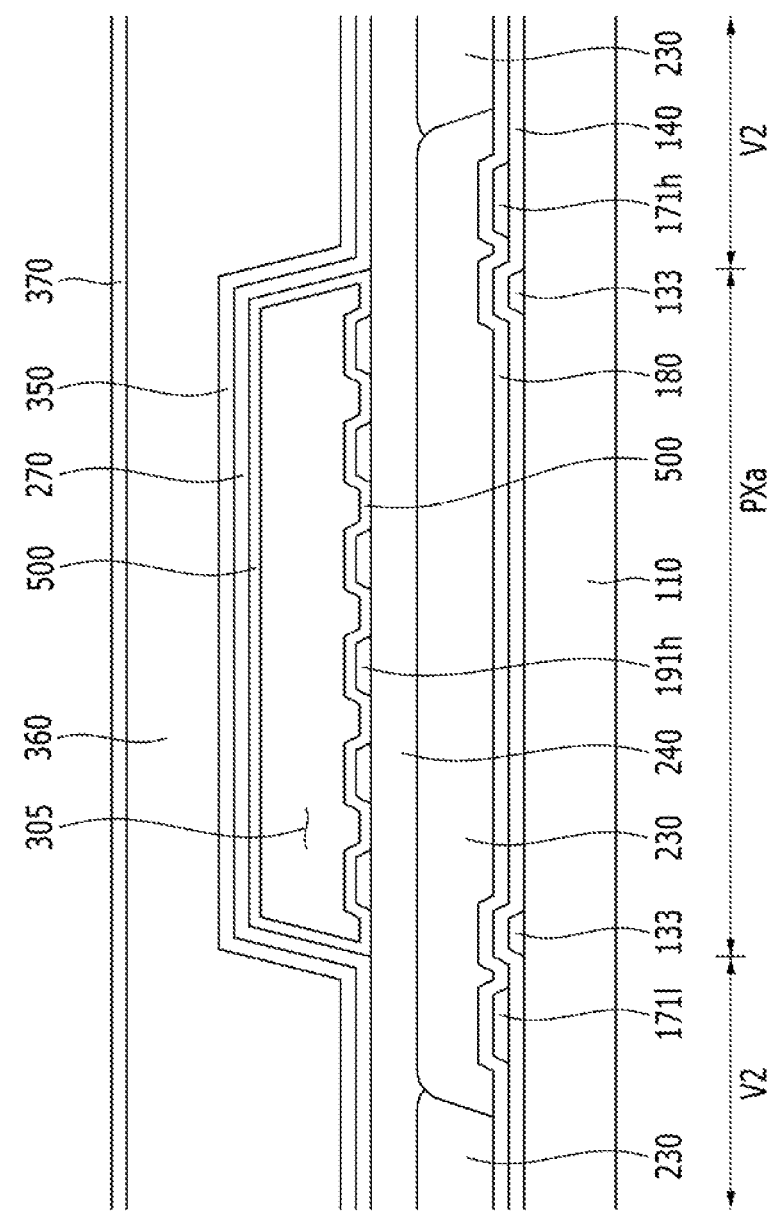

As illustrated in FIG. 16, the sacrificial layer 300 is removed by supplying the developing solution, the stripper solution, or the like onto the substrate 110 in which the sacrificial layer 300 is exposed. If the sacrificial layer 300 is removed, the microcavity 305 is formed at a position in which the sacrificial layer 300 was positioned.

The sacrificial layer 300 is reacted with light in the curing process of the roof layer 360 to be partially altered. Accordingly, a portion of the sacrificial layer 300 remains in the process of removing the sacrificial layer 300 to become an altered layer 500. The altered layer 500 is formed of a portion of the sacrificial layer 300, which is in contact with the pixel electrode 191, and a portion of the sacrificial layer 300, which is in contact with the common electrode 270. Since the altered layer 500 includes the components of the sacrificial layer 300, the altered layer 500 includes a sulfur component and a chlorine component.

Figure 17:
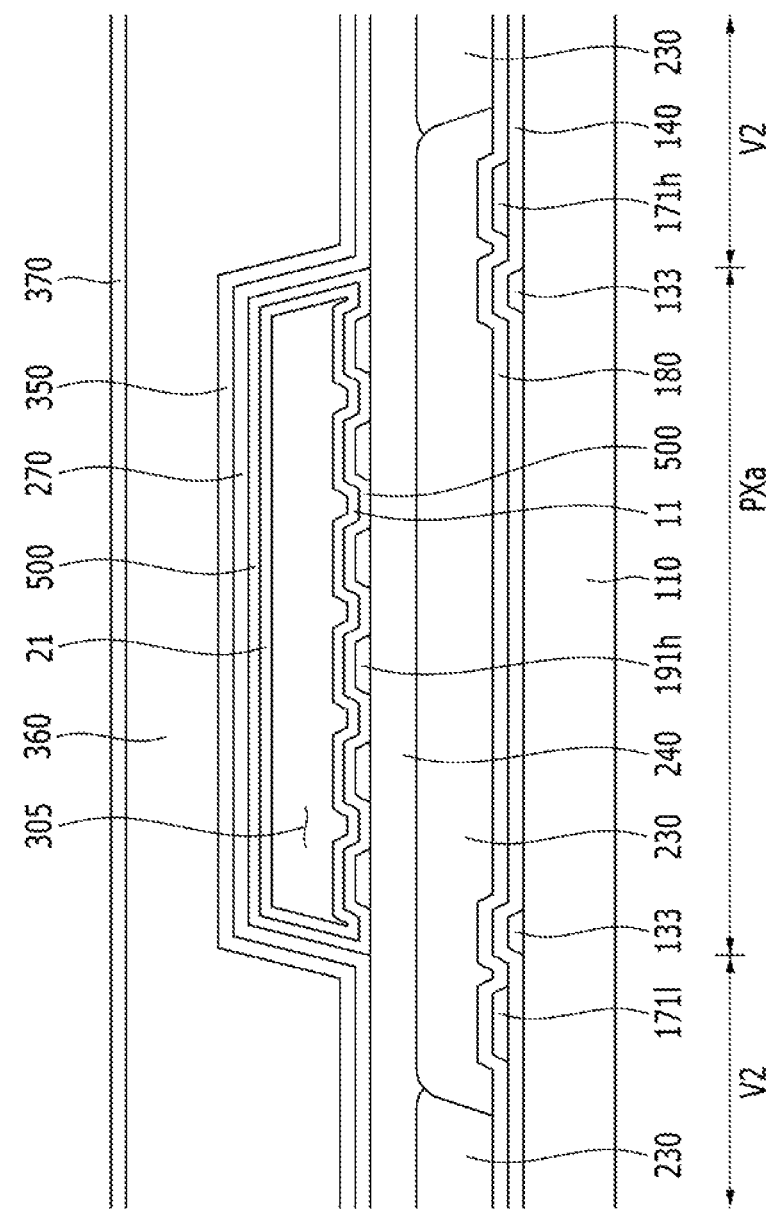

As illustrated in FIG. 17, if the aligning agent including the aligning material is dripped on the substrate 110 by a spin coating method or an inkjet method, the aligning agent is injected into the microcavity 305. If the curing process is performed after the aligning agent is injected into the microcavity 305, a solution component is vaporized, and the aligning material remains on an inner wall surface of the microcavity 305 to form the alignment layers 11 and 21.

The alignment layers 11 and 21 include the first alignment layer 11 and the second alignment layer 21. The first alignment layer 11 may be formed on the pixel electrode 191, and the second alignment layer 21 may be formed beneath the common electrode 270. The first alignment layer 11 and the second alignment layer 21 are formed to face each other while the microcavity 305 is interposed therebetween, and are formed to be connected to each other at the lateral wall of the edge of the microcavity 305.

The altered layer 500 is positioned between the pixel electrode 191 and the first alignment layer 11, and between the common electrode 270 and the second alignment layer 21.

In the present exemplary embodiment, the oxygen ashing process for removing the altered layer of the sacrificial layer 300 may be omitted and thus the present exemplary embodiment may be simplified by forming the alignment layers 11 and 21 without removing the altered layer 500 of the sacrificial layer 300. Further, since there is no concern about damage to the first insulating layer 240 or the light blocking member 220 due to the oxygen ashing process, it is fine not to form the inorganic insulating layer for protecting the first insulating layer 240 and the light blocking member 220. Accordingly, like this, the process of forming the inorganic insulating layer may be omitted and thus the present exemplary embodiment may be simplified. Accordingly, the pixel electrode 191 is positioned directly on the first insulating layer 240, and the encapsulation layer 390 as will be described later is positioned directly on the light blocking member 220.

Figure 18:
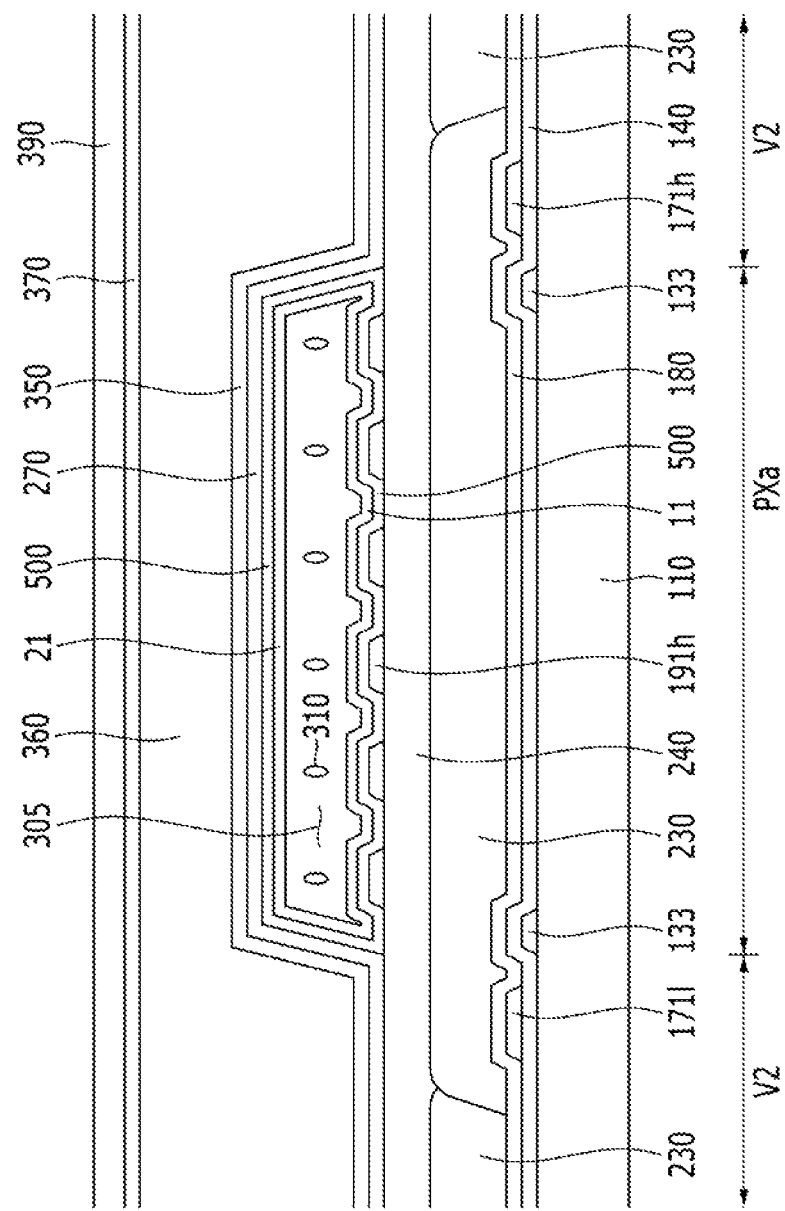

As illustrated in FIG. 18, if the liquid crystal material is dripped on the substrate 110, the liquid crystal material is injected into the microcavity 305, and the liquid crystal layer formed of the liquid crystal molecules 310 is formed.

Subsequently, the microcavity 305 is sealed by forming the encapsulation layer 390 on the roof layer 360.

While the inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

<Description of symbols>

| | |
|---|---|
| 11: First alignment layer | 21: Second alignment layer |
| 110: Substrate | 121: Gate line |
| 124h: First gate electrode | 124l: Second gate electrode |
| 131: Storage electrode line | 133, 135: Storage electrode |
| 140: Gate insulating layer | 154h: First semiconductor |
| 154l: Second semiconductor | 171: Data line |
| 171h: First data line | 171l: Second data line |
| 173h: First source electrode | 173l: Second source electrode |
| 175h: First drain electrode | 175l: Second drain electrode |
| 180: Passivation layer | 181h: First contact hole |
| 181l: Second contact hole | 191: Pixel electrode |
| 220: Light blocking, member | 230: Color filter |
| 240: First insulating layer | 270: Common electrode |
| 300: Sacrificial layer | 305: Microcavity |
| 307a, 307b: Injection hole | 310: Liquid crystal molecule |
| 350: Second insulating layer | 360: Roof layer |
| 370: Third insulating layer | 390: Encapsulation layer |
| 500: Altered layer | |

What is claimed is:

1. A method of manufacturing a display device, comprising:
   forming a thin film transistor on a substrate;
   forming a pixel electrode to be connected to the thin film transistor;
   forming a sacrificial layer on the pixel electrode;
   forming a common electrode on the sacrificial layer;
   forming a roof layer on the common electrode;
   patterning the common electrode and the roof layer to expose a portion of the sacrificial layer;
   removing the sacrificial layer to form a microcavity between the pixel electrode and the common electrode while simultaneously forming an alignment layer in direct contact with both the pixel electrode and the common electrode;
   injecting a liquid crystal material into the microcavity to form a liquid crystal layer; and
   forming an encapsulation layer to cover a portion where the microcavity is exposed and to seal the microcavity,
   wherein in the removing of the sacrificial layer, a portion of the sacrificial layer, which contacts with the pixel electrode and the common electrode, remains to form the alignment layer.

2. The method of claim 1, wherein:
   the sacrificial layer includes a photosensitive material, a siloxane resin, and a reaction group.

3. The method of claim 2, wherein:
   the photosensitive material is formed of at least any one of a PAC (photoactive compound), a PAG (photoacid generator), and a photoinitiator.

4. The method of claim 2, wherein:
   the reaction group is formed of an alkyl group or a methyl group.

5. The method of claim 1, wherein:
   the alignment layer includes a sulfur component and a chlorine component.

6. The method of claim 1, wherein:
   the removing of the sacrificial layer includes a process of supplying a stripper solution to a portion where the sacrificial layer is exposed.

7. The method of claim 6, wherein:
   the removing of the sacrificial layer does not include an oxygen ashing process.

* * * * *